(12) United States Patent
Kang et al.

(10) Patent No.: US 8,068,361 B2
(45) Date of Patent: Nov. 29, 2011

(54) SYSTEMS AND METHODS FOR PERFORMING A PROGRAM-VERIFY PROCESS ON A NONVOLATILE MEMORY BY SELECTIVELY PRE-CHARGING BIT LINES ASSOCIATED WITH MEMORY CELLS DURING THE VERIFY OPERATIONS

(75) Inventors: Sang-Gu Kang, Gyeonggi-do (KR); Hee-won Lee, Seoul (KR); Ju Seok Lee, Jeollabuk-do (KR); Jung-Ho Song, Gyeonggi-do (KR)

(73) Assignee: Samsung Electronics Co., Ltd., Gyeonggi-do (KR)

(*) Notice: Subject to any disclaimer, the term of this patent is extended or adjusted under 35 U.S.C. 154(b) by 187 days.

(21) Appl. No.: 12/533,720

(22) Filed: Jul. 31, 2009

(65) Prior Publication Data

US 2010/0034019 A1  Feb. 11, 2010

(30) Foreign Application Priority Data

Aug. 6, 2008  (KR) .................. 10-2008-0077033

(51) Int. Cl.
*G11C 16/04* (2006.01)

(52) U.S. Cl. .......... 365/185.03; 365/185.22; 365/185.24

(58) Field of Classification Search .............. 365/185.03, 365/185.18, 185.17, 185.22, 185.24, 185.25
See application file for complete search history.

(56) References Cited

U.S. PATENT DOCUMENTS

| | | | |
|---|---|---|---|
| 6,125,052 A | 9/2000 | Tanaka | |
| 7,868,604 B2* | 1/2011 | Tran et al. | ..................... 323/317 |
| 2006/0202274 A1* | 9/2006 | Shukuri et al. | ............... 257/365 |
| 2006/0221688 A1* | 10/2006 | Shukuri et al. | .......... 365/185.05 |
| 2008/0025102 A1 | 1/2008 | Chen et al. | |

FOREIGN PATENT DOCUMENTS

| | | |
|---|---|---|
| JP | 11-176182 | 7/1999 |
| JP | 2000-048582 | 2/2000 |
| KR | 1019990048771 A | 7/1999 |
| KR | 1020040057536 A | 7/2004 |
| KR | 1020080009073 A | 1/2008 |

* cited by examiner

*Primary Examiner* — Gene N Auduong
(74) *Attorney, Agent, or Firm* — Myers Bigel Sibley & Sajovec

(57) ABSTRACT

A nonvolatile memory system is operated by performing a program loop on each of a plurality of memory cells, each program loop comprising at least one program-verify operation and selectively pre-charging bit lines associated with each of the plurality of memory cells during the at least one program-verify operation.

18 Claims, 24 Drawing Sheets

SYSTEMS AND METHODS FOR PERFORMING A PROGRAM-VERIFY PROCESS ON A NONVOLATILE MEMORY BY SELECTIVELY PRE-CHARGING BIT LINES ASSOCIATED WITH MEMORY CELLS DURING THE VERIFY OPERATIONS

CROSS REFERENCE TO RELATED APPLICATION

This application claims the benefit of and priority to Korean Patent Application No. 10-2008-77033, filed Aug. 6, 2008, in the Korean Intellectual Property Office, the disclosure of which is hereby incorporated herein by reference as if set forth in its entirety.

BACKGROUND OF THE INVENTION

The present invention relates generally to data processing systems and, more particularly, to the use of storage devices, such as nonvolatile memory systems in data processing systems.

Recently, the number of devices using nonvolatile memories has increased. An MP3 player, a digital camera, a mobile phone, a camcorder, a flash card, and a solid state disk (SSD) are examples of devices that use nonvolatile memories as storage devices.

As more devices use nonvolatile memories as storage devices, the capacity of nonvolatile memories is generally increasing. One method for increasing memory capacity is use of a so-called multi level cell (MLC) method in which a plurality of bits is stored in one memory cell.

A two-bit MLC may be programmed to have any one of four states 11, 01, 10 and 00 according to distribution of a threshold voltage. This is illustrated, for example, in FIG. 1 where a two-bit MLC is programmed to have one of four states 11 (E), 01 (P1), 10 (P2), and 00 (P3). A nonvolatile memory, such as a flash memory may be programmed in units of a page. A memory controller may transfer data to a flash memory through a buffer memory. A page buffer in the flash memory temporarily stores the data loaded from the buffer memory and programs the loaded data into a selected page. After completing the programming operation, a program-verifying operation is carried out to determine whether the data have been correctly programmed.

As shown in FIG. 2, however, a NAND flash structure, for example, may include a column select line (CSL), which is ideally at a ground or reference voltage level when a read operation is performed. Typically, however, the CSL has parasitic resistance (e.g., R1) associated therewith. As a result, the read currents I[n−1], I[n], I[n+1], and I[n+2] can cause voltage drops due to this parasitic resistance. Such voltage drops may be called CSL noise.

FIG. 3 is a diagram that illustrates the effects of CSL noise on a two-bit MLC programmed in the P1 state. Ideally the CSL is at a ground or reference voltage level. Due to CSL noise, however, the cell state takes on a new, wider distribution, which can cause errors during a program-verify operation.

SUMMARY

According to some embodiments of the present invention, a nonvolatile memory system is operated by performing a program loop on each of a plurality of memory cells, each program loop comprising at least one program-verify operation and selectively pre-charging bit lines associated with each of the plurality of memory cells during the at least one program-verify operation.

In other embodiments the method further comprises determining a noise level in the memory device. Wherein selectively pre-charging the bit lines comprises selectively pre-charging the bit lines based on the determined noise level.

In still other embodiments, the noise level is based on a parasitic resistance of a column select line associated with the plurality of memory cells.

In still other embodiments, the method further comprises determining when the noise level falls below a threshold, increasing a number of bit lines selectively pre-charged when the noise level falls below the threshold and reducing a number of the at least one program-verify operation when the noise level falls below the threshold.

In still other embodiments, determining when the noise level falls below the threshold comprises determining the noise level during each of the program loops and comparing the determined noise level with the threshold.

In still other embodiments, determining when the noise level falls below the threshold comprises determining the noise level at specific intervals during performing the program loops and comparing the determined noise level with the threshold.

In still other embodiments, determining the noise level comprises determining the noise level before performing the program loops. Wherein selectively pre-charging the bit lines comprises selectively pre-charging the bit lines based on the noise level determined before performing the program loops. The method further comprising determining a number of the at least one program-verify operation based on the noise level determined before performing the program loops.

In still other embodiments, the method further comprises increasing a number of bit lines selectively pre-charged after a predetermined number of program loops and reducing the number of the at least one program-verify operation after the predetermined number of program loops.

In still other embodiments, each of the memory cells is a multi-level cell has a plurality of programmable states. Wherein selectively pre-charging the bit lines comprises selectively pre-charging bit lines associated with at least one of the plurality of programmable states.

In further embodiments, a memory system, comprises a memory controller and a nonvolatile memory communicatively coupled to the memory controller, the memory being operable to perform a program loop on each of a plurality of memory cells, each program loop comprising at least one program-verify operation and to selectively pre-charge bit lines associated with each of the plurality of memory cells during the at least one program-verify operation.

In still further embodiments, the memory is further operable to determine a noise level in the memory device and to selectively pre-charge the bit lines the bit lines based on the determined noise level.

In still further embodiments, the noise level is based on a parasitic resistance of a column select line associated with the plurality of memory cells.

In still further embodiments, the memory is further operable to determine when the noise level falls below a threshold, to increase a number of bit lines selectively pre-charged when the noise level falls below the threshold, and to reduce a number of the at least one program-verify operation when the noise level falls below the threshold.

In still further embodiments, the memory is operable to determine when the noise level falls below the threshold by determining the noise level during each of the program loops and comparing the determined noise level with the threshold.

In still further embodiments, the memory is operable to determine when the noise level falls below the threshold by determining the noise level at specific intervals during performing the program loops, the memory being further operable to compare the determined noise level with the threshold.

In still further embodiments, the memory is operable to determine the noise level by determining the noise level before performing the program loops, to selectively pre-charge the bit lines by selectively pre-charging the bit lines based on the noise level determined before performing the program loops, the memory being further operable to determine a number of the at least one program-verify operation based on the noise level determined before performing the program loops.

In still further embodiments, the memory is further operable to increase a number of bit lines selectively pre-charged after a predetermined number of program loops, and to reduce the number of the at least one program-verify operation after the predetermined number of program loops.

In still further embodiments, each of the memory cells is a multi-level cell having a plurality of programmable states. The memory being operable to selectively pre-charge the bit lines by selectively pre-charging bit lines associated with at least one of the plurality of programmable states.

In further embodiments, a nonvolatile memory comprises a memory cell array having a plurality of memory cells connected between a common source line and a bit line, each memory cell being conditioned in a plurality of programmed states, and a data input/output control circuit conducting a program-verify operation on data programmed (hereinafter, referred to as 'program data') in the memory cell array, wherein the data input/output control circuit counts the number of program data bits corresponding each to the programmed states during the program-verify operation and conducts the program-verify operation by regional split with the plurality of memory cells in accordance with the number of program data bits.

In still further embodiments, the data input/output control circuit comprises a data input/output circuit receiving the program data, and a counter counting the number of program data bits input from the data input/output circuit.

Other systems and methods according to embodiments of the invention will be or become apparent to one with skill in the art upon review of the following drawings and detailed description. It is intended that all such additional systems and methods be included within this description, be within the scope of the present invention, and be protected by the accompanying claims.

BRIEF DESCRIPTION OF THE DRAWINGS

Other features of the present invention will be more readily understood from the following detailed description of specific embodiments thereof when read in conjunction with the accompanying drawings, in which.

DETAILED DESCRIPTION OF EMBODIMENTS

Figure 1:
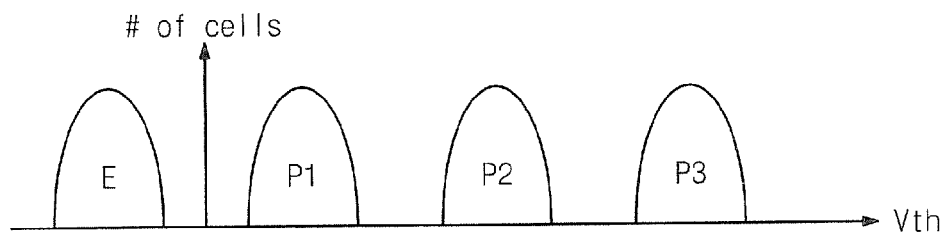
FIG. 1 is a diagram that illustrates the programming states for a two-bit multi-level memory cell.
Figure 2:
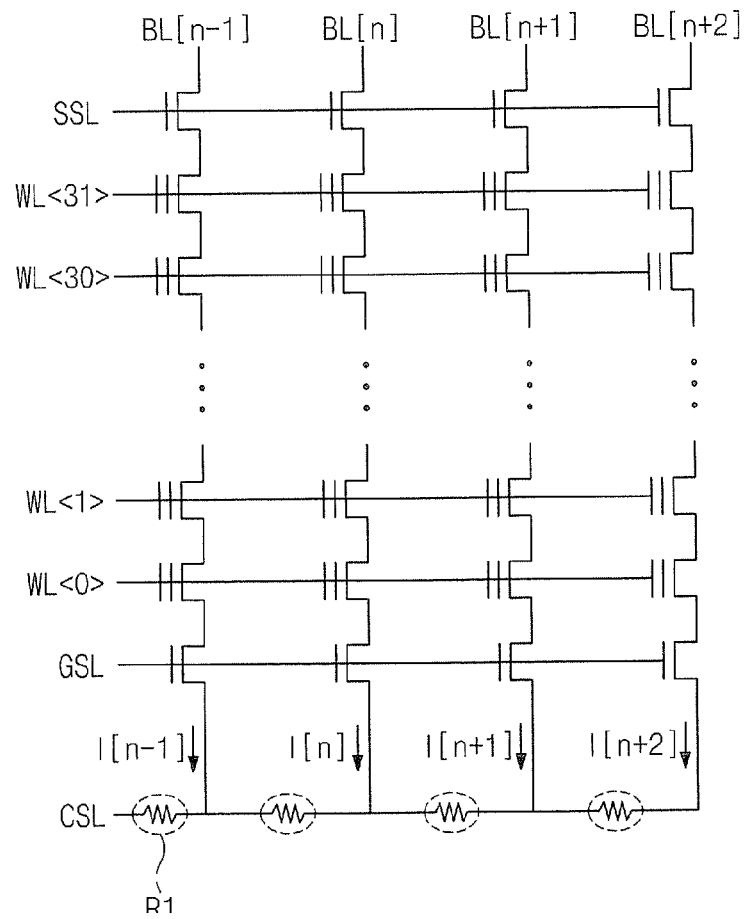
FIG. 2 is a schematic of a NAND flash memory structure that illustrates column select line (CSL) parasitic resistance.

While the invention is susceptible to various modifications and alternative forms, specific embodiments thereof are shown by way of example in the drawings and will herein be described in detail. It should be understood, however, that there is no intent to limit the invention to the particular forms disclosed, but on the contrary, the invention is to cover all modifications, equivalents, and alternatives falling within the spirit and scope of the invention as defined by the claims. Like reference numbers signify like elements throughout the description of the figures.

As used herein, the singular forms "a," "an," and "the" are intended to include the plural forms as well, unless expressly stated otherwise. It should be further understood that the terms "comprises" and/or "comprising" when used in this specification is taken to specify the presence of stated features, integers, steps, operations, elements, and/or components, but does not preclude the presence or addition of one or more other features, integers, steps, operations, elements, components, and/or groups thereof. It will be understood that when an element is referred to as being "connected" or "coupled" to another element, it can be directly connected or coupled to the other element or intervening elements may be present. Furthermore, "connected" or "coupled" as used herein may include wirelessly connected or coupled. As used herein, the term "and/or" includes any and all combinations of one or more of the associated listed items.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and this specification and will not be interpreted in an idealized or overly formal sense unless expressly so defined herein.

For purposes of illustration, various embodiments of the present invention are described herein with reference to a nonvolatile memory system comprising a flash memory data storage device. It will be understood that the data storage device is not limited to implementation as a flash memory device, but can be implemented generally as an erase before write memory device. Thus, the data storage device may be a memory card device, Solid State Drive (SSD) device, ATA bus device, Serial ATA (SATA) bus device, Multi-Media Card (MMC) device, Secure Digital (SD) device, memory stick device, Hard Disk Drive (HDD) device, Hybrid Hard Drive (HHD) device, and/or a Universal Serial Bus (USB) flash drive device.

According to some embodiments of the present invention, a nonvolatile memory system can be operated so as to reduce the effects of noise, such as, for example, CSL noise, during program-verify operations by performing program loops on each of the memory cells with each program loop comprising one or more program-verify operations and selectively pre-charging bit lines associated with each of the memory cells during the program-verify operation(s). By pre-charging select ones of the bit lines, the read currents generated during the program-verify operations can be reduced and, as a result, the CSL noise caused by the voltage drops due to the CSL parasitic resistance can be reduced. The selective pre-charging of specific bit lines may have the effect of dividing, for example, a page of a flash memory into regions for program verification. At the beginning of the program verification process, few memory cells have completed program verification, which results in generally greater levels of the CSL noise. As a result, fewer bit lines may be pre-charged at the beginning of the program verification process resulting in an increased number of verify steps. As the number of memory cells that have completed the program verification process increases, the level of the the CSL noise may decrease allowing a greater number of bit lines to be pre-charged during the program-verify operations. This may result in a decreased number of verify steps.

Figure 4:
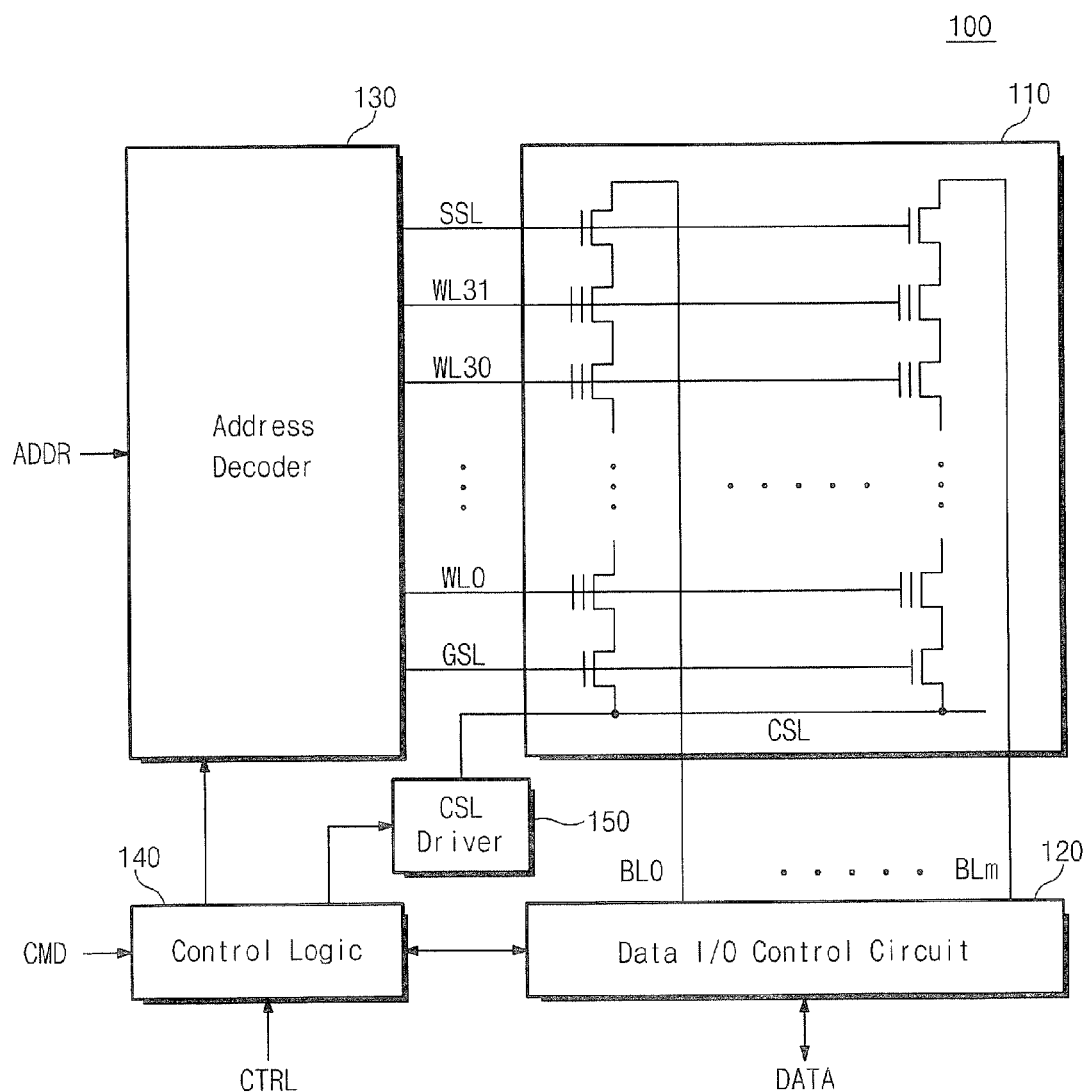
FIG. 4 illustrates is a block diagram of a nonvolatile memory device according to some embodiments of the present invention.

FIG. 4 illustrates is a block diagram of a nonvolatile memory device according to some embodiments of the present invention. As an embodiment, a flash memory device is illustrated in FIG. 4. However, the present invention is not limited to a flash memory device. It may be understood that the present invention can be applied to various nonvolatile memory devices such as, but not limited to, a read only memory ROM, a programmable ROM, a electrically programmable ROM, a electrically programmable and erasable ROM, a flash memory, a phase change ROM, a magnetic ROM, a ferroelectric ROM, a resistive ROM, etc.

Referring to FIG. 4, the flash memory device 100 includes a memory cell array 110, a data input/output (I/O) control circuit 120, an address decoder 130, a control logic 140, and a CSL driver 150.

The memory cell array 110 includes a plurality of memory blocks. FIG. 4 shows one memory block as a representative. Each memory block is composed of a plurality of pages. Each page is formed of a plurality of memory cells. Each memory cell may store multi-bit data or single bit data. The flash memory device 100 conducts an erasing operation in units of a memory block, and a reading or writing operation in units of a page.

Each memory block is composed of a plurality of cell strings. Referring to FIG. 4, each cell string includes a string selection transistor connected to a string selection line SSL, a plurality of memory cells coupled to a plurality of word lines WL0~WL31, and a ground selection transistor connected to a ground selection line GSL. The string selection transistors are connected each to bit lines BL0~BLm, while the ground selection transistors are connected to a common source line CSL.

Generally in the reading operation of the flash memory device 100, a power source voltage VDD is applied to the string and ground selection lines SSL and GSL. A selective read voltage Vrd is applied to a selected word line (e.g., WL0) while a deselective read voltage Vread is applied to unselected word lines (e.g., WL1~WL31). Here, the deselective read voltage Vread has a voltage level high enough to turn on memory cells coupled to the unselected word lines WL1~WL31.

The data input/output control circuit 120 is connected to the memory cell array 110 through the plurality bit lines BL0~BLm. The data input/output control circuit 120 receives data DATA by way of a data input/output line (not shown). The data input/output control circuit 120 temporarily stores data programmed or to be programmed (hereinafter, referred to as "program data") into selected memory cells of the plurality memory cells. Data stored in the data input/output control circuit 120 is programmed into selected memory cells during the programming operation. Further, the data input/output control circuit 120 reads data out of selected memory cells through the plurality of bit lines. The readout data is output to external by way of the data input/output line.

In the meantime, the data input/output control signal 120 conducts a program-verify operation, splitting (or dividing) the memory cell array 110 into regions during each programming loop. Then it is able to lessen the CSL noise. Here, the noise means a voltage drop due to resistive components on the common source line CSL. The common source line CSL is generally connected to the ground terminal through a metal line. A metal line inherently contains resistive components.

Therefore, when current flows through the common source line CSL, a voltage drop occurs there. Such a voltage drop on the common source line CSL may cause widths of the threshold voltage distributions to be broadened over the memory cells.

Still referring to FIG. 4, the address decoder 130 is connected to the memory cell array 110 by way of the plurality of word lines WL0~WL31. The address decoder 130 receives an address ADDR and selects a memory block or page. Here, an address for selecting a memory block is referred to as 'block address' and an address for selecting a page is referred to as "page address."

The control logic 140 controls the data input/output control circuit 120, the address decoder 130, and the CSL driver 150 in response to a command CMD and a control signal CTRL. The control signal CTRL is provided from a memory interface 425 (refer to FIG. 26) or a memory controller 512 (refer to FIG. 27). The control logic 140 generates bias voltages to be applied to the word lines in the writing, reading, and erasing operations.

For the reading operation, the control logic 140 generates the selective read voltage Vrd applied to the selected word line, and a deselective read voltage Vread applied to the unselected word lines. Usually, the deselective read voltage Vread is higher than the selective read voltage Vrd. For the program-verify operation, the control logic 140 generates a program-verifying voltage Vvfy applied to the selected word line.

The CSL driver 150 is connected to the common source line CSL. The structural and operational features of the CSL driver 150 will be detailed in conjunction with FIG. 5. In a general flash memory device, a noise is due to resistive components resident in the common source line CSL, thereby causing the threshold voltage distributions of the memory cells to be wider. The flash memory device 100 is operable in a region split scheme, which may be effective in reducing the CSL noise. As a result, it may be possible to resolve the problem of widening threshold voltage distributions of the memory cells.

Figure 5:
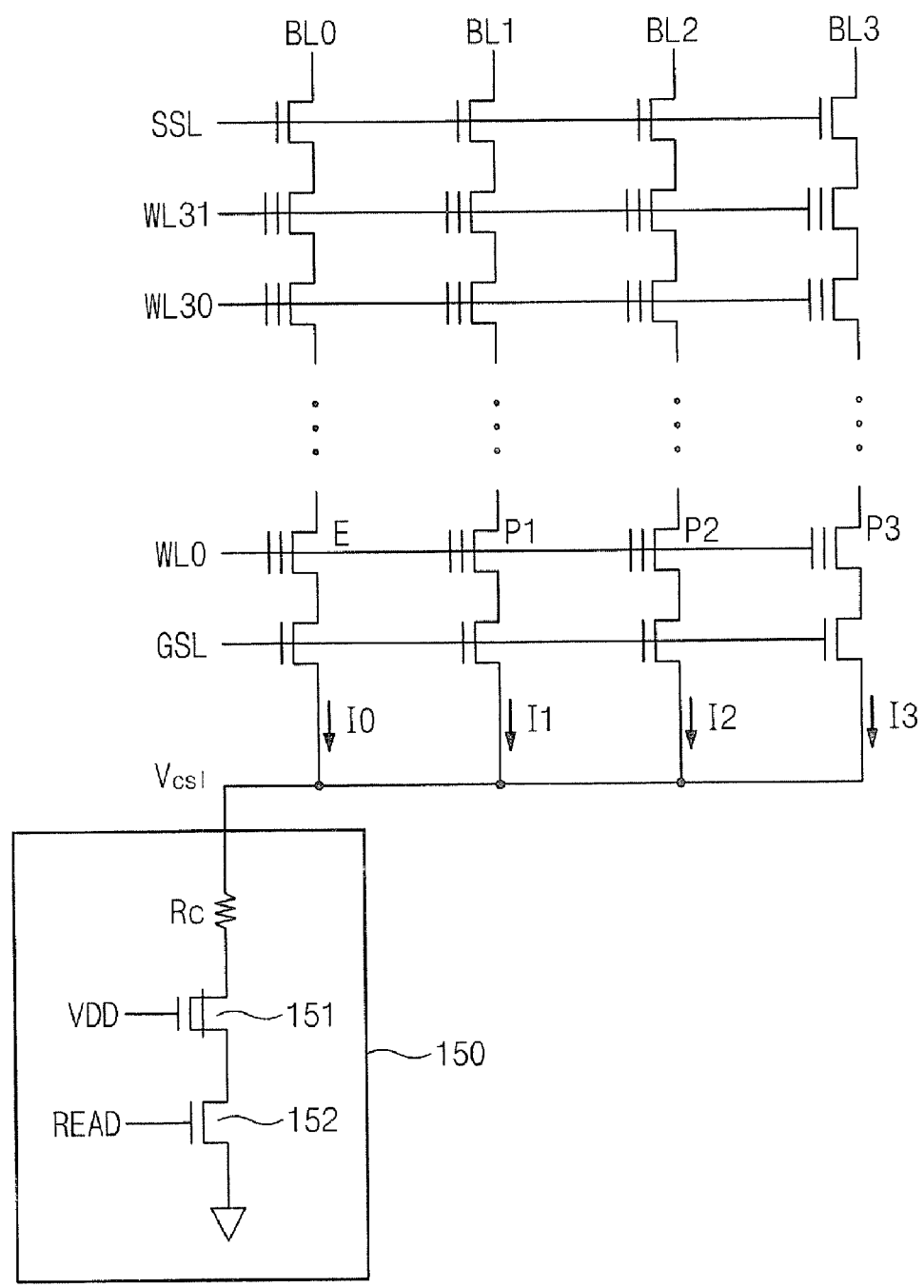
FIG. 5 illustrates a circuit diagram of the CSL driver shown in FIG. 4.

FIG. 5 illustrates a circuit diagram of the CSL driver 150 shown in FIG. 4. Referring to FIG. 5, the CSL driver 150 includes a metal-oxide-semiconductor (MOS) depletion transistor 151 and an NMOS transistor 152.

In FIG. 5, the reference mark Rc denotes parasitic resistor or capacitor resident on the common source line CSL (hereinafter called "parasitic resistor"). When current is flowing through the common source line CSL, a voltage drop may be generated along the common source line CSL due to the parasitic resistance Rc therein. During this, the common source line CSL is charged with a predetermined voltage (hereinafter, referred to as 'CSL voltage Vcsl'). If the CSL voltage Vcsl is charged on the common source line CSL, the threshold voltage distributions of the memory cells would be broadened in width.

As illustrated in FIG. 5, the transistors 151 and 152 of the CSL driver 150 are serially connected between the common source line CSL and the ground terminal. The power source voltage VDD is applied to a gate of the MOS depletion transistor 151 and a control signal READ is applied to a gate of the NMOS transistor 152. The control signal READ is activated in the reading operation, but inactivated in other operations. Herein, the reading operation may be learned as including a program-verify operation. The MOS depletion transistor 151 is provided for preventing the NMOS transistor 152 from being destroyed when a high voltage is applied to the common source line CSL.

From FIG. 5, it can be seen that the CSL driver 150 is shared by pluralities of the cell strings. Each cell string is connected between the bit line BL and the common source line CSL. FIG. 5 exemplarily shows a configuration that four cell strings are connected between the bit lines BLi (i=0, 1, 2, 3) and the common source line CSL. The CSL voltage Vcsl is variable by an amount of current flowing through the cell strings. During the reading and program-verifying operations, an amount of current flowing through the cell strings is dependent on the number of on-cells thereof.

For considering a variation of the CSL voltage Vcsl in accordance with the number of on-cells, two items will be assumed as follows. One is that memory cells coupled to the selected word line WL0 are programmed into states E, P1, P2, and P3. The state E means an erased state. Memory cells conditioned in the state P3 have the highest threshold voltage. Memory cells conditioned in the states P1 and P2 have intermediate levels between the states E and P3. The other is that I0, I1, I2, and I3 denote currents flowing each through the cell strings when the memory cells coupled to the selected word line WL0 are on-cells.

Under the assumption, the CSL voltage Vcsl varies by the number of on-cells. For instance, if the memory cells of the state E are on-cells and the rest is off-cells, the CSL voltage Vcsl becomes I0×Rc. If the memory cells of the states E and P1 are on-cells, the CSL voltage Vcsl becomes (I0+I1)×Rc. As also, if the memory cells of the states E, P1 and P2 are on-cells, the CSL voltage Vcsl becomes (I0+I1+I2)×Rc. This means that in the program-verify and reading operation, the CSL voltage Vcsl is variable as the number of on-cells changes.

Figure 6:
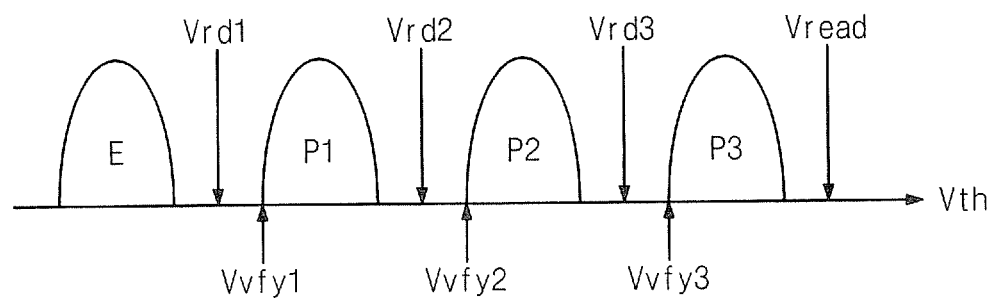
FIG. 6 illustrates threshold voltage distributions of the memory cells shown in FIG. 1.

FIG. 6 illustrates threshold voltage distributions of the memory cells shown in FIG. 1. Referring to FIG. 6, a memory cell is conditioned in one of the four states E, P1, P2, and P3.

During the reading operation, the selective read voltages Vrd1, Vrd2, and Vrd3 are sequentially applied to the selected word line WL0, while the deselective read voltage Vread is applied to the unselected word lines WL1~WL31. The first selective read voltage Vrd1 has a voltage level between the erased state E and the first programmed state P1. The second selective read voltage Vrd2 has a voltage level between the first and second programmed states P1 and P2. The third selective read voltage Vrd3 has a voltage level between the second and third programmed states P2 and P3.

When the first selective read voltage Vrd1 is being applied to the selected word line WL0, the memory cells of the erased state E become on-cells and the memory cells of the first through third programmed states P1~P3 become off-cells. When the second selective read voltage Vrd2 is being applied to the selected word line WL0, the memory cells of the erased state E and the first programmed state P1 become on-cells and the memory cells of the second and third programmed states P2 and P3 become off-cells. When the third selective read voltage Vrd3 is being applied to the selected word line WL0, the memory cells of the erased state E and the first and second programmed states P1 and P2 become on-cells and the memory cells of the third programmed state P3 become off-cells.

In the meantime, during the program-verify operation, program-verifying voltages Vvfy1, Vvft2, and Vvfy3 are sequentially applied to the selected word line WL0. The first program-verifying voltage Vvfy1 is provided for programming the memory cells into the first programmed state P1. The second program-verifying voltage Vvfy2 is provided for programming the memory cells into the second programmed state P2. The third program-verifying voltage Vvfy2 is provided for programming memory cells into the third programmed state P3.

Figure 7:
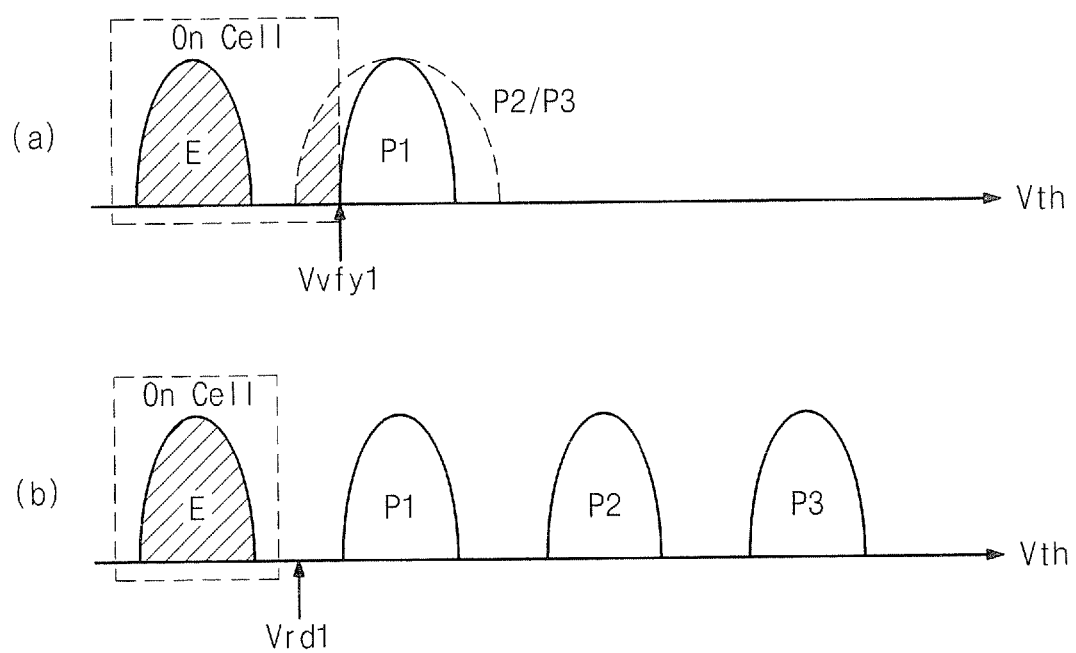
FIG. 7A illustrates threshold voltage distributions of on-cells when the first program-verifying voltage is applied to the selected word line WL0.
FIG. 7B illustrates threshold voltage distributions of on-cells when the first selective read voltage is applied to the selected word line WL0.

FIGS. 7A and 7B illustrate the numbers of on-cells when the program-verifying and read voltages are applied to the selected word line WL0, from which it can be seen that the number of on-cells is variable during the program-verify operation and reading operation. As aforementioned in conjunction with FIG. 5, the CSL voltage Vcsl is variable by a change of the number of on-cells for the memory cells connected to the selected word line.

FIGS. 7A and 7B illustrate threshold voltage distributions by the program-verify operation for programming the selected memory cells into the first programmed state P1, and by the reading operation for reading data from the memory cells conditioned in the first programmed state P1.

FIG. 7A illustrates threshold voltage distributions of on-cells when the first program-verifying voltage Vvfy1 is applied to the selected word line WL0. In FIG. 7A, the hatching portions denote the threshold voltage distributions of memory cells that turn to on-cells when the first program-verifying voltage Vvfy1 is applied to the selected word line. These on-cells can be made from the memory cells of the erased state E and memory cells, which do not reach a level of the first program-verifying voltage Vvfy1 in threshold voltage, among the memory cells that will be programmed into the second or third programmed state P2 or P3.

FIG. 7B illustrates threshold voltage distributions of on-cells when the first selective read voltage Vrd1 is applied to the selected word line WL0. In FIG. 7B, the hatching portion denotes the threshold voltage distribution of memory cells that turn to on-cells when the first selective read voltage Vrd1 is applied to the selected word line. The memory cells conditioned in the erased state E are on-cells. As the reading operation begins after completing all steps of the programming operation, different from the program-verifying operation, the memory cells to be programmed into the second or third programmed state P2 or P3 have already arrived at the second or third programmed state P2 or P3. Thus, only the memory cells conditioned in the erased state E turn to on-cells when the first selective read voltage Vrd1 is applied to the selected word line WL0.

Comparing FIG. 7A with FIG. 7B, even in the reading operation for sensing the first programmed state P1, it can be seen that the numbers of on-cells (i.e., on-cell counts) may be different between the program-verify operation and the reading operation. An on-cell count by the program-verify operation is larger than that of the reading operation. This difference of on-cell counts is because of memory cells, which have not reached the first program-verifying voltage Vvfy1 in threshold voltage, among the memory cells to be programmed into the second or third programmed state P2 or P3.

Figure 8:
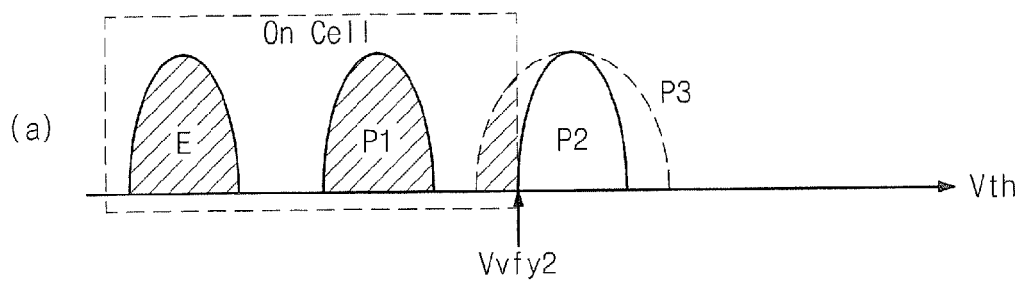
FIG. 8A illustrates threshold voltage distributions of on-cells when the second program-verifying voltage is applied to the selected word line WL0.
FIG. 8B illustrates threshold voltage distributions of on-cells when the second selective read voltage is applied to the selected word line WL0.
Figure 8:
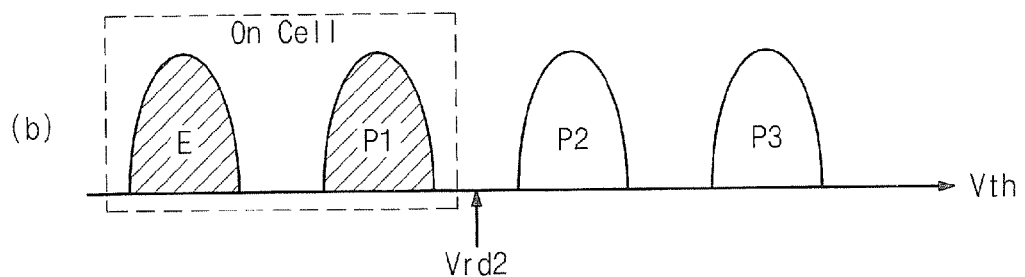

FIGS. 8A and 8B illustrate threshold voltage distributions by the program-verify operation for programming the selected memory cells into the second programmed state P2, and by the reading operation for reading data from the memory cells conditioned in the second programmed state P2.

FIG. 8A illustrates threshold voltage distributions of on-cells when the second program-verifying voltage Vvfy2 is applied to the selected word line WL0. On-cells determined while applying the second program-verifying voltage Vvfy2 are correspondent to the memory cells of the erased data E and the first programmed state P1 and memory cells, which have not yet arrived at the second program-verifying voltage Vvfy2 in threshold voltage, among the memory cells to be programmed into the third programmed state P3.

FIG. 8B illustrates threshold voltage distributions of on-cells when the second selective read voltage Vrd2 is applied to the selected word line WL0. Referring to FIG. 8B, on-cells determined while applying the second selective read voltage Vrd2 are correspondent to the memory cells of the erased data E and the first programmed state P1. This is because the memory cells to be programmed into the third programmed state P3 have already reached the third programmed state P3.

Comparing FIG. 8A with FIG. 8B, even in the reading operation for sensing the second programmed state P2, it can be seen that the on-cell counts may be different between the program-verify operation and the reading operation. An on-cell count by the program-verify operation is larger than that of the reading operation. This difference of on-cell counts arises from the fact that memory cells, among the memory cells to be programmed into the third programmed state P3, have not yet reached the second program-verifying voltage Vvfy2 in threshold voltage.

Figure 9:
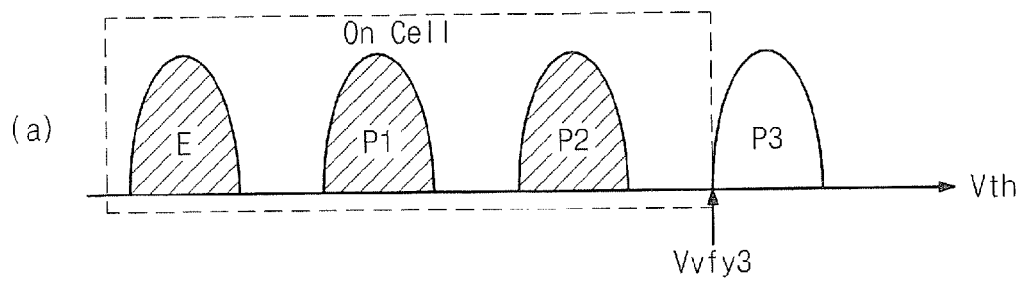
FIG. 9A illustrates threshold voltage distributions of on-cells when the third program-verifying voltage is applied to the selected word line WL0.
FIG. 9B illustrates threshold voltage distributions of on-cells when the third selective read voltage is applied to the selected word line WL0.
Figure 9:
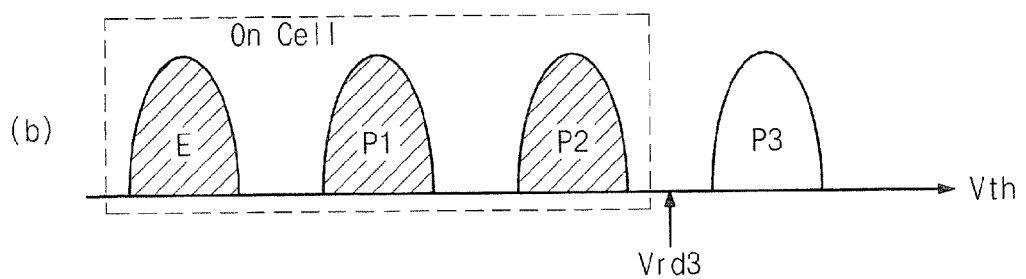

FIGS. 9A and 9B illustrate threshold voltage distributions by the program-verify operation for programming the selected memory cells into the third programmed state P3, and by the reading operation for reading data from the memory cells conditioned in the third programmed state P3.

FIG. 9A illustrates threshold voltage distributions of on-cells when the third program-verifying voltage Vvfy3 is applied to the selected word line WL0. On-cells determined while applying the third program-verifying voltage Vvfy3 are correspondent to the memory cells, which are conditioned in the erased data E and the first and second programmed states P1 and P2. FIG. 9B illustrates threshold voltage distributions of on-cells when the third selective read voltage Vrd3 is applied to the selected word line WL0. Referring to FIG. 9B, on-cells determined while applying the third selective read voltage Vrd3 are correspondent to the memory cells which are conditioned in the erased data E and the first and second programmed states P1 and P2.

Comparing FIG. 9A with FIG. 9B, while reading the memory cells of the third programmed state P3, it can be seen that the on-cell counts are the same with each other in the program-verify operation and reading operation. This is because the memory cells programmed into the third programmed state P3 have all reached the third program-verifying voltage Vvfy3 in threshold voltage.

Figure 3:
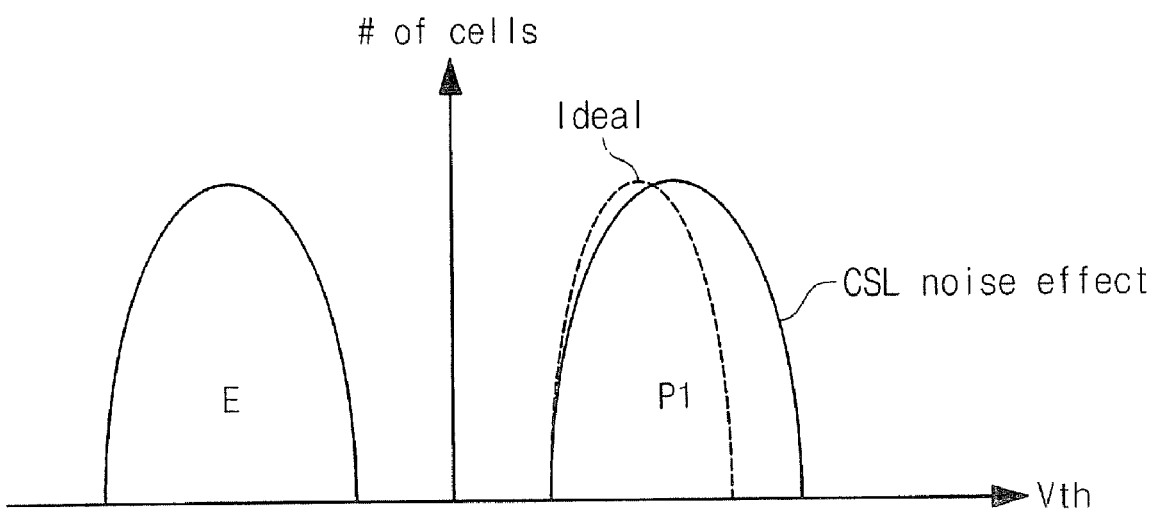
FIG. 3 is a graph that illustrates the effects of CSL noise on programming state distribution for a multi-level cell.

Referring to FIGS. 7A through 9B, the on-cell counts may be different between the program-verifying operation for programming the memory cells into the first or second programmed state P1 or P2 and the reading operation for reading data from the memory cells of the first or second programmed state P1 or P2. If there is a difference of the on-cell counts between the program-verifying and reading operations, the CSL voltage Vcsl varies as aforementioned. Noises resident in the CSL may cause the threshold voltage distributions of the memory cells to be wider, as described above referring to FIG. 3.

Figure 10:
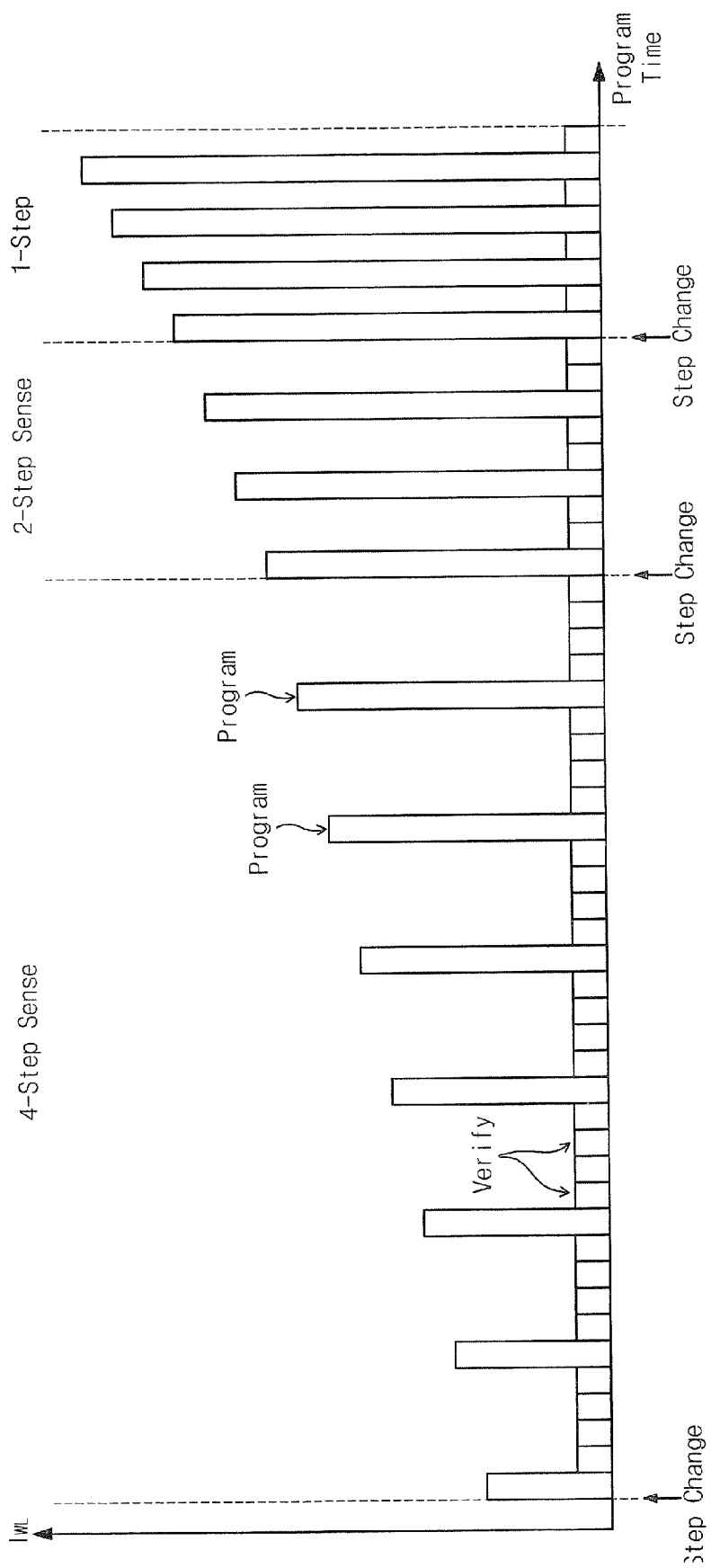
FIG. 10 illustrates program and read-verify operations of the flash memory device according to some embodiments of the present invention.

FIG. 10 illustrates program and read-verify operations of the flash memory device 100 according to some embodiments of the present invention. As shown in FIG. 10, the CSL noise may be greater at the beginning of the program verification process because few memory cells have completed the verification process. According to some embodiments of the present invention, fewer bit lines are pre-charged at the beginning of the program-verify process, which results in an increased number of verify steps. In the example shown in FIG. 10, the number of bit lines pre-charged at the beginning of the program-verify process results in four verify steps for a period of time. After a number of memory cells have completed the verification process, the CSL noise may decrease allowing an increased number of bit lines to be pre-charged during the program-verify operations. In the example shown in FIG. 10, the number of bit lines that are pre-charged is increased, which results in a reduction of the number of verify steps from four to two. As the verification process proceeds, the CSL noise decreases further allowing the number of bit lines that are pre-charged to be further increased, which results in a reduction of the number of verify steps from two to one.

Figure 11:
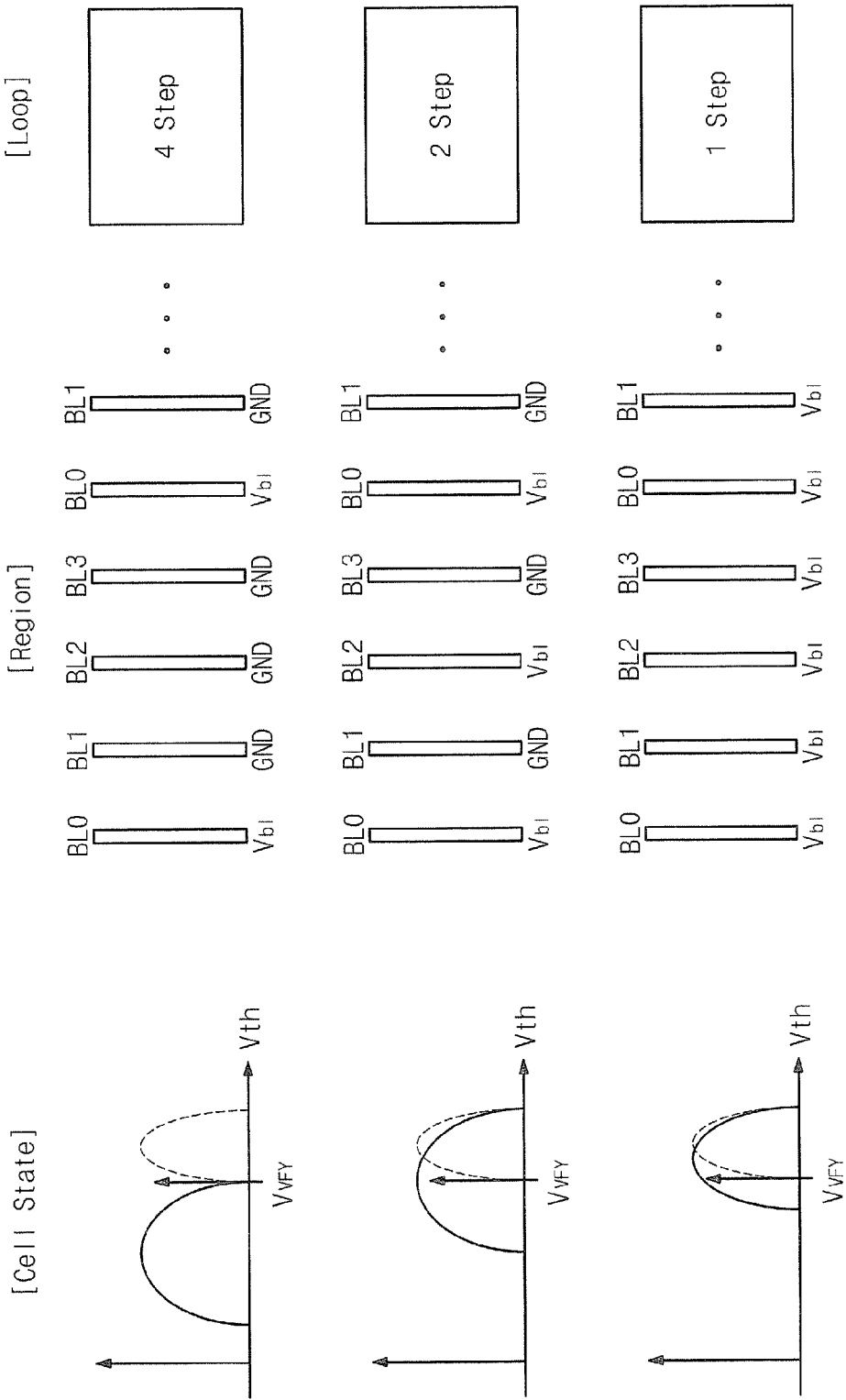
FIG. 11 illustrates how the program-verify process according to some embodiments of the present invention effectively divides the memory cells into regions in a page of the flash memory device.

FIG. 11 illustrates how the program-verify process according to some embodiments of the present invention effectively divides the memory cells into regions in, for example, a page of the flash memory device 100. As shown in FIG. 10, in a memory in which four bit lines are used per memory cell the program-verify operations begin by pre-charging only one of the four bit lines to Vb1 at a time while grounding the remaining three bit lines resulting in a four step verify process. As more cells complete the program verification process and the CSL noise decreases, two of the four bit lines are pre-charged to Vb1 while grounding the remaining two bit lines resulting in a two step verify process. Finally, as even more cells complete the program verification process and the CSL noise decreases further, all four bit lines are pre-charged to Vb1 resulting in a one step verify process.

Figure 12:
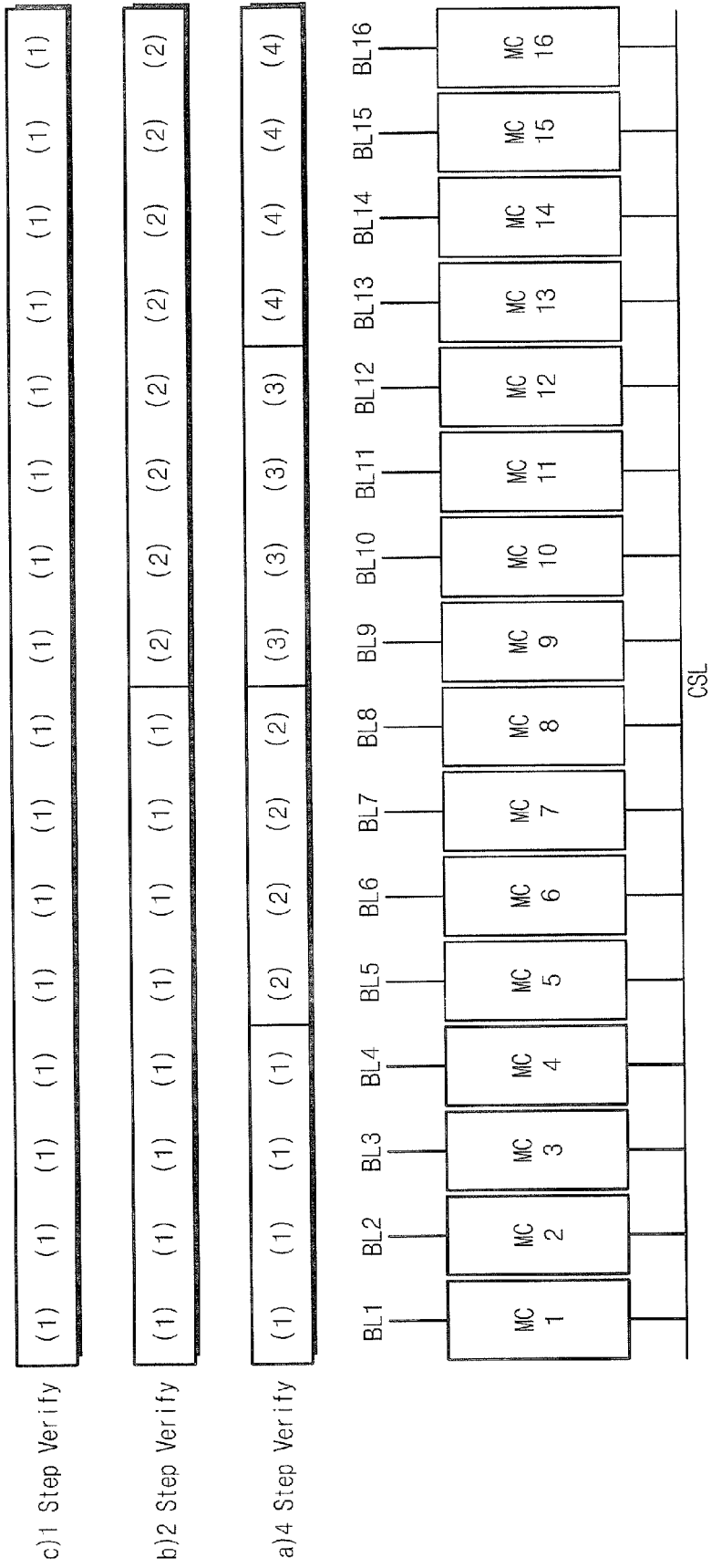
FIG. 12A to 12C shows an embodiment of verifying node according to the present invention.

FIGS. 12A, 12B, and 12C illustrate an embodiment of the region split scheme according to the programming method of the present invention. In FIGS. 12A~12C, it is assumed that a page is composed of 16 memory cells MC1~MC16. The memory cells MC1~MC16 are connected between their corresponding bit lines BL1~BL16 and the common source line CSL.

FIG. 12A shows a 4-step verifying mode. Referring to FIG. 12A, a page is split into 4 regions. A first region corresponds to the 1st through 4th memory cells MC1~MC4. A second region corresponds to the 5th through 8th memory cells MC5~MC8. A third region corresponds to the 9th through 12th memory cells MC9~MC12. A fourth region corresponds to the 13th through 16th memory cells MC13~MC16.

Returning to FIG. 10, at the beginning of the program-verify process, the program execution is carried out to one page at a time. In other words, the program execution is conducted to all of the memory cells MC1~M16 at a time. But the program verification is conducted in four times from the first to fourth regions in sequence. That is, after completing the program verification to the memory cells MC1~MC4 included in the first region, the rest of the memory cells MC5~MC16 of the second through fourth regions are sequentially program-verified.

FIG. 12B shows a 2-step verifying mode. Referring to FIG. 12B, a page is split into 2 regions. A first region corresponds to the 1st through 8th memory cells MC1~MC8. A second region corresponds to the 9th through 18th memory cells MC5~MC8. After a number of memory cells have completed the verification process as described referring to FIG. 10, the program execution is carried out one page at a time, but the program verification is twice conducted from the first to second regions in sequence.

FIG. 12C shows a 1-step verifying mode. Referring to FIG. 12C, the flash memory device is operable with the program execution and verification to each page without splitting the page into a plurality of regions.

The region split scheme shown in FIGS. 12A through 12C is figured out by dividing adjacent memory cells into a plurality of regions. For instance, as illustrated in FIG. 12A, splitting one page into 4 regions, the 1st through 4th memory cells MC1~MC4 are included into one region.

FIGS. 13A, 13B, and 13C illustrate another embodiment of the region split scheme according to the programming method of the present invention. In FIGS. 13A~13c, it is assumed that a page is composed of 16 memory cells MC1~MC16. The memory cells MC1~MC16 are connected between their corresponding bit lines BL1~BL16 and the common source line CSL.

FIG. 13A illustrates a 4-step verifying mode. Referring to FIG. 13A, a page is split into 4 regions. A first region corresponds to the 1st, 5th, 9th, and 13th memory cells MC1, MC5, MC9, and MC13. A second region corresponds to the 2nd, 6th, 10th, and 14th memory cells MC2, MC6, MC10, and MC14. A third region corresponds to the 3rd, 7th, 11th, and 15th memory cells MC3, MC7, MC11, and MC15. A fourth region corresponds to the 4th, 8th, 12th, and 16th memory cells MC4, MC8, MC12, and MC16. As like the case of FIG. 12A, the program verification is conducted four times from the first to fourth regions in sequence.

FIG. 13B shows a 2-step verifying mode. Referring to FIG. 13B, a page is split into 2 regions. A first region corresponds to the odd-numbered memory cells MCi (i=1, 3, 5, 7, 9, 11, 13, 15), i.e., the 1st, 3rd, 5th, 7th, 9th, 11th, 13th, and 15th memory cells MC1, MC3, MC5, MC7, MC9, MC11, MC13, and MC15. A second region corresponds to the even-numbered memory cells MCj (j=2, 4, 6, 8, 10, 12, 14, 16), i.e., 2nd, 4th, 6th, 8th, 10th, 12th, 14th, and 16th memory cells MC2, MC4, MC6, MC8, MC10, MC12, MC14, and MC16. Similar to the example of FIG. 12B, the program verification is twice conducted from the first to second regions in sequence.

FIG. 13C shows a 1-step verifying mode. Referring to FIG. 13C, the flash memory device is operable with the program execution and verification to each page without splitting the page into a plurality of regions.

Figure 13:
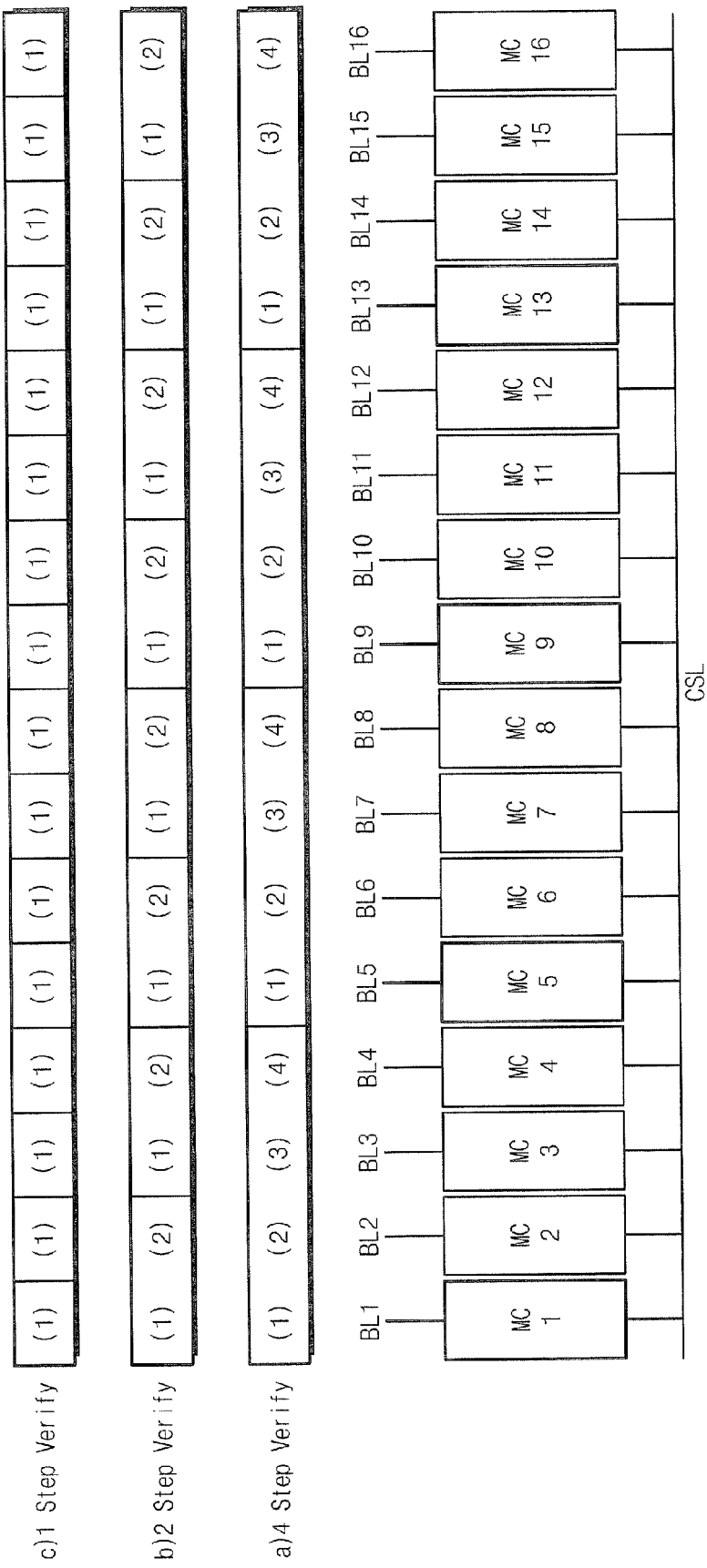
FIG. 13A to 13C illustrates another embodiment of verifying mode according to the present invention.

The region split scheme shown in FIGS. 13A through 13C is figured out by dividing adjacent memory cells into a plurality of regions. For instance, as illustrated in FIG. 13A, splitting one page into 2 regions, the odd and even-numbered memory cells MC1~MC15 and MC2~MC16 are included into different regions from each other. Practically, the region split scheme of the flash memory device 100 according to the present invention is modifiable or alterable, not restrictive to the aforementioned embodiments shown in FIGS. 12A through 13C.

Returning to FIG. 10, the flash memory device 100 according to some embodiments of the present invention operates by varying the number of split regions in prosecuting the programming loops. At the early stage of the programming loops, because most of the memory cells are on-cells, the common source line CSL is inadvertently involved in a larger degree of noise. For the purpose of lessening the CSL noise, the flash memory device 100, according to some embodiments of the present invention, operates by splitting a page into plural regions and conducting the program-verifying operation in the unit of split region. For instance, at the 4-step verifying mode of the early stage of programming loops, each page is split into 4 regions and then the program-verifying operation is carried out in 4 times.

At the intermediate stage of programming loops, because memory cells that have been programmed are increasing, an on-cell count becomes smaller in the program-verifying operation. Then, it is possible to accelerate a programming rate by reducing the number of split regions less than the early stage of the programming loops. In the 2-step verifying mode during the intermediate stage of programming loops, a page is split into 2 regions and the program-verifying operation is conducted twice.

At the late stage of programming loops, the memory cells are mostly programmed. Thus, a programming rate is further accelerated by once executing the program-verifying operation without regional split. That is, by the 1-step verifying mode during the late stage of programming loops, the program-verifying operation is carried out once without splitting a page into plural regions.

The flash memory device 100 according to some embodiments of the present invention, as shown in FIG. 10, is able to raise a programming rate, as well as reducing the CSL noise, by adjusting the number of split regions by the programming loops. Ways of varying the number of split regions by the programming loops will be detailed with reference to FIGS. 14 through 16. Varying the number of split regions is carried out by detecting the CSL voltage Vcsl.

Figure 14:
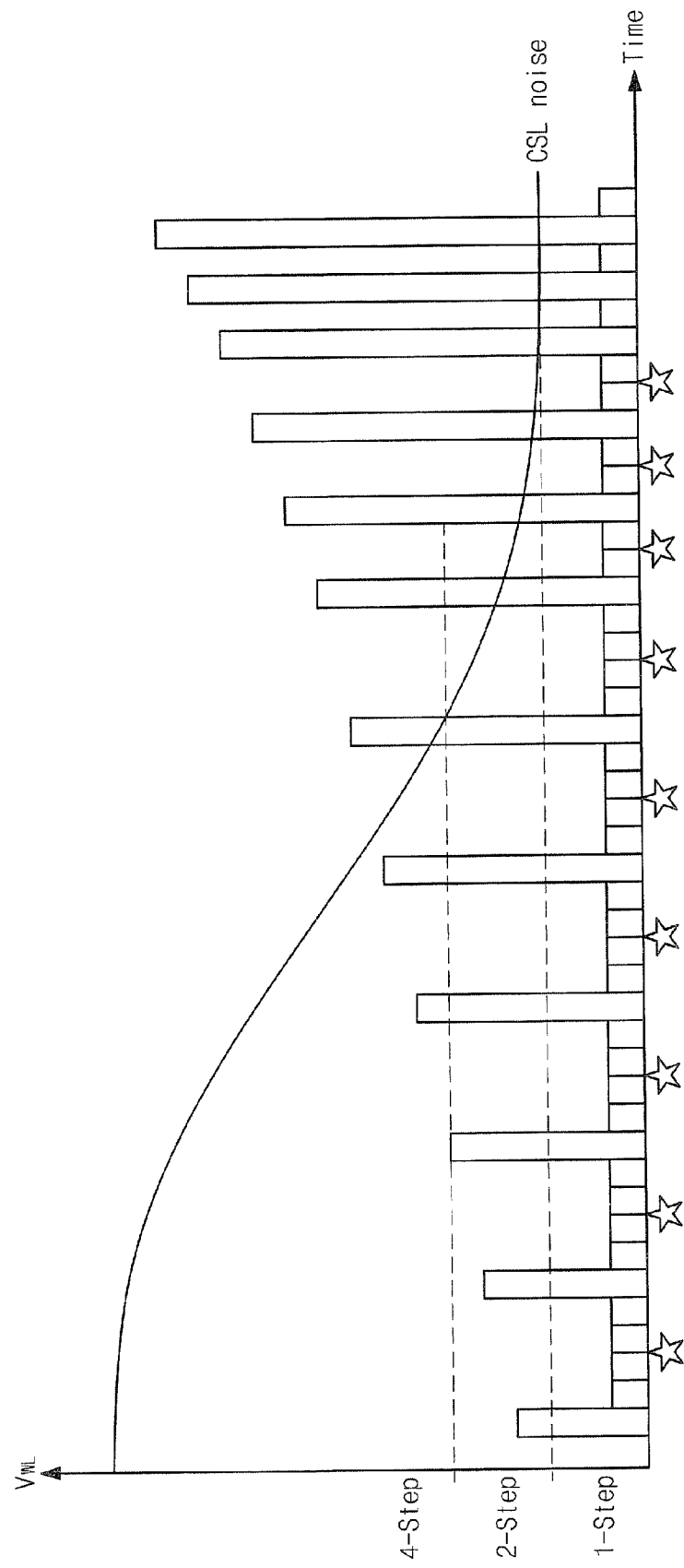
FIGS. 14 to 16 are graph diagrams that illustrate various embodiments of the present invention for determining the number of bit lines to pre-charge during the program-verify process.
Figure 15:
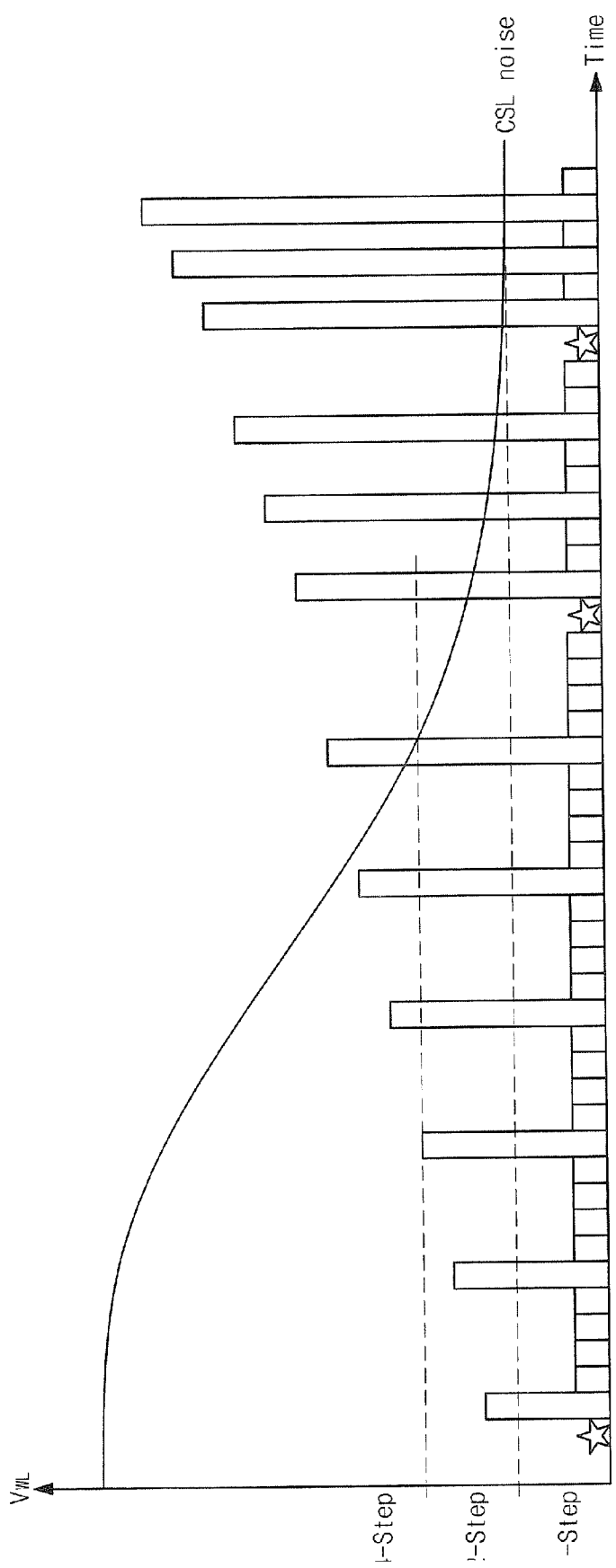
Figure 16:
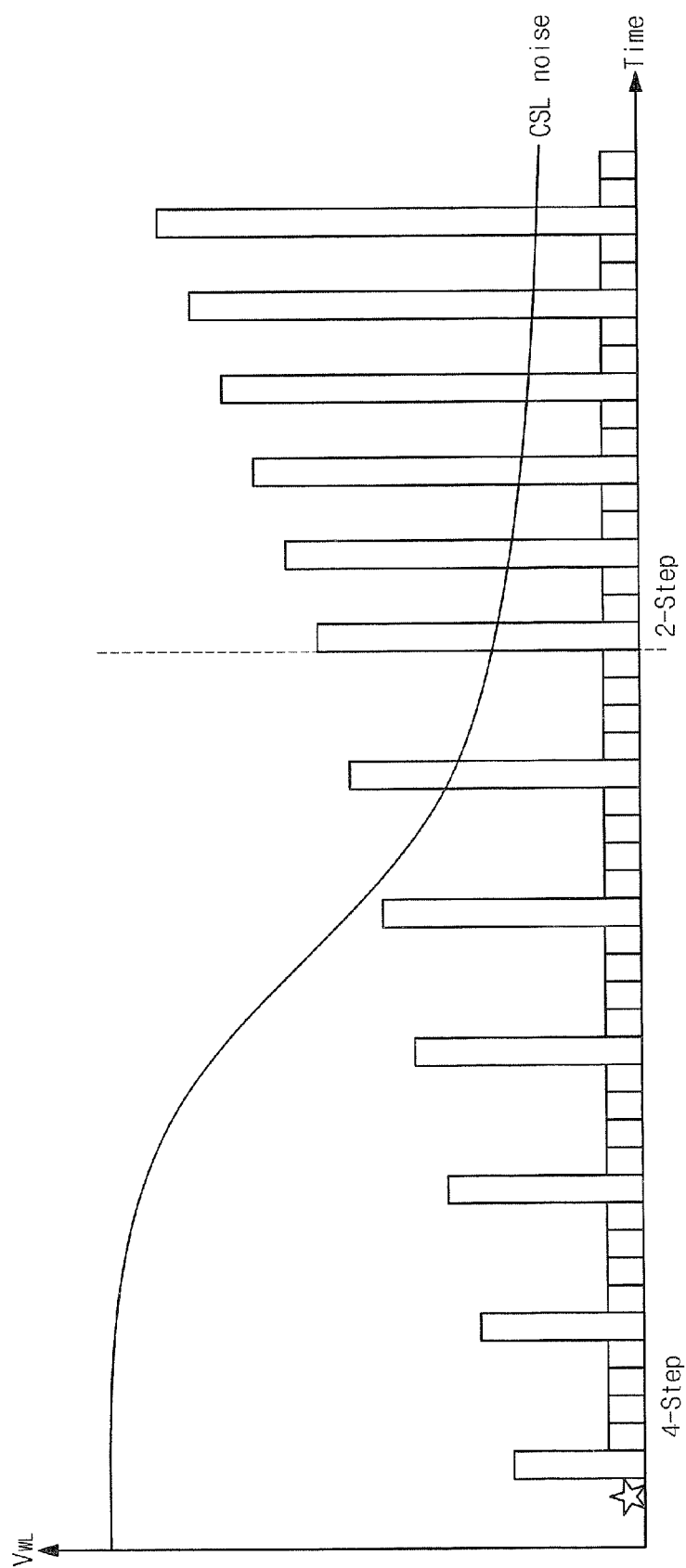

FIGS. 14-16 are graph diagrams that illustrate various embodiments of the present invention for determining the number of bit lines to pre-charge during the program-verify process and, as a result, the number of program-verify operation steps. In general, a determination may be made of when the noise level, such as the CSL noise level (e.g. the CSL voltage Vcsl), falls below a threshold (e.g. a predetermined reference voltage). The number of bit lines that are pre-charged during the program-verify process may be reduced, which results in fewer program-verify operation steps, upon the noise level falling below the threshold.

As shown in FIG. 14, the CSL noise level, for example, may be determined (represented by a star) during each of the program loops including, for example, at each verify operation step, and compared with a threshold. When the CSL noise level (e.g. the CSL voltage Vcsl) falls below a first threshold (e.g. a first predetermined reference voltage), the number of bit lines that are pre-charged is reduced to thereby reduce the number of program-verify steps from four to two. Similarly, when the CSL noise level (e.g. the CSL voltage Vcsl) falls below a second threshold (e.g. a second predetermined reference voltage), the number of bit lines that are pre-charged is reduced further to thereby reduce the number of program-verify steps from two to one.

The way of adjusting the number of split regions does not confine a period for detecting the CSL voltage Vcsl to a specific time. That is, during the current programming loop, the CSL voltage Vcsl is detected and the number of split regions of the next programming loop is determined.

FIG. 15 illustrates a similar approach as that of FIG. 14, except that rather than determining the CSL noise level during each program loop, the CSL noise level is determined at specific intervals using, for example, a dummy pre-charge operation. As the way of adjusting the number of split regions shown in FIG. 15 is carried out by pre-charging all bit lines, it is useful in raising a detection level of the CSL voltage Vcsl, while extending a programming time due to pluralities of dummy pre-charge periods.

FIG. 16 illustrates yet another approach for determining a number of bit lines to pre-charge during the program-verify process. As shown in FIG. 16, the CSL noise is determined before performing any of the program loop operations to determine the initial number of bit lines to be pre-charged and the number of program-verify steps. Rather than make subsequent determination(s) of the CSL noise to compare with one or more threshold values, the number of bit lines that are pre-charged is automatically increased and, as a result, the number of program-verify steps is decreased after a specific or predetermined number of program loops, such as, for example, after a set number of memory cells have completed program verification.

A dummy pre-charge operation is once executed at the beginning of the programming operation. During the dummy pre-charge period, the flash memory device 100 pre-charges all of the bit lines and detects the CSL noise. According to a detected level of the CSL noise, it determines the number of split regions by the programming loops. The number of split regions by the programming loops can be determined in accordance with predetermined data after detecting the CSL voltage Vcsl.

The aforementioned approaches for adjusting the number of split regions, shown in FIGS. 14 through 16, are configured by detecting the CSL noise level and determining the number of split regions for the next programming loop in accordance with a detected level of the CSL noise. Different from those approaches, the flash memory device 100 according to some embodiments of the present invention is able to set the number of split regions in each programming loop, without detecting the CSL noise.

Exemplarily, it is assumed that the number of programming loops is 10. Then, the 4-step verifying mode is conducted in the 1st through 4th programming loops. The 2-step verifying mode is conducted in the 5th through 7th programming loops. The 1-step verifying mode is conducted in the 8th through 10th programming loops. Further, the flash memory device according to the present invention is able to adjust the number of split regions by counting the number of program data bits.

Figure 17:
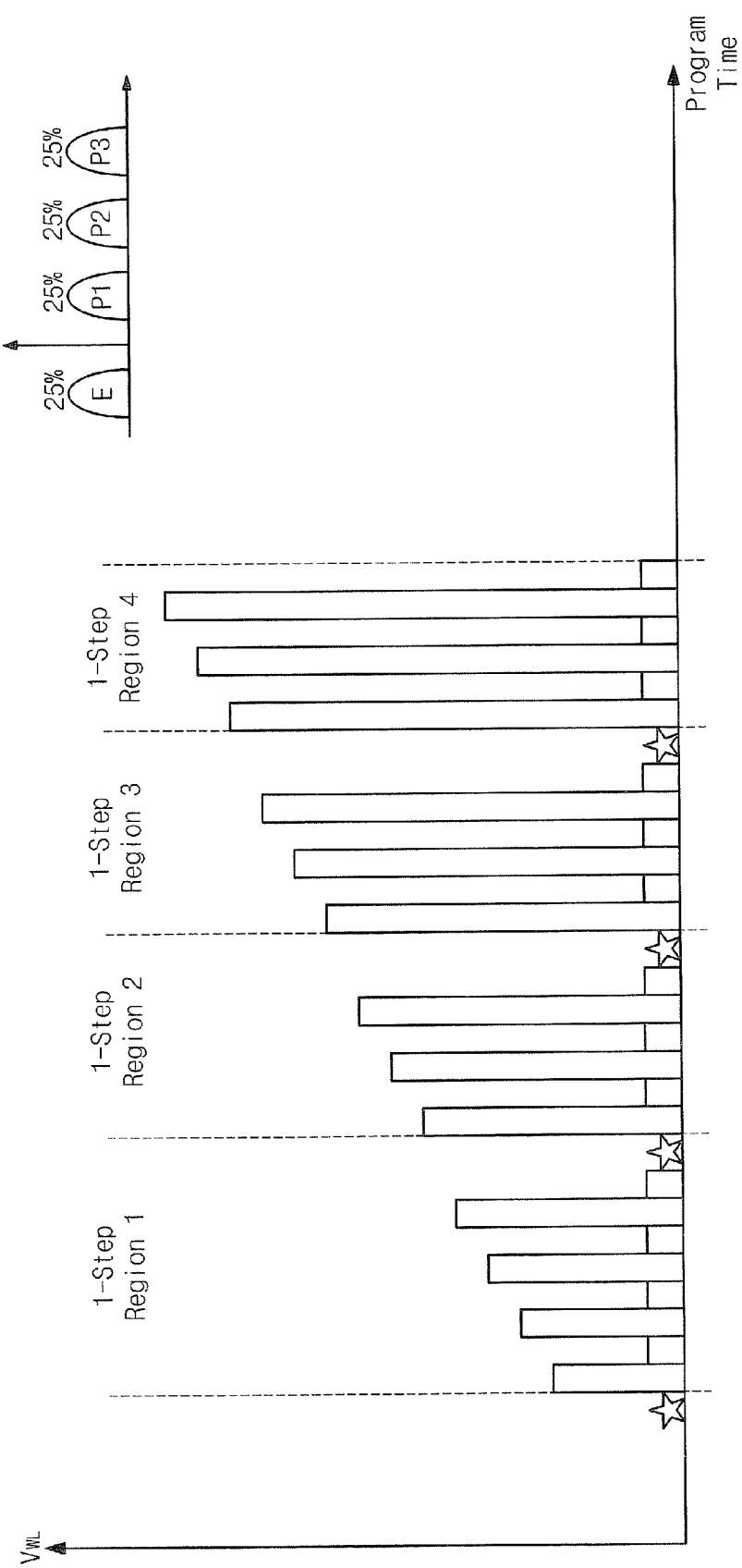
FIGS. 17 and 18 are examples that illustrate the relative performance of performing program-verify operations according to some embodiments of the present invention.
Figure 18:
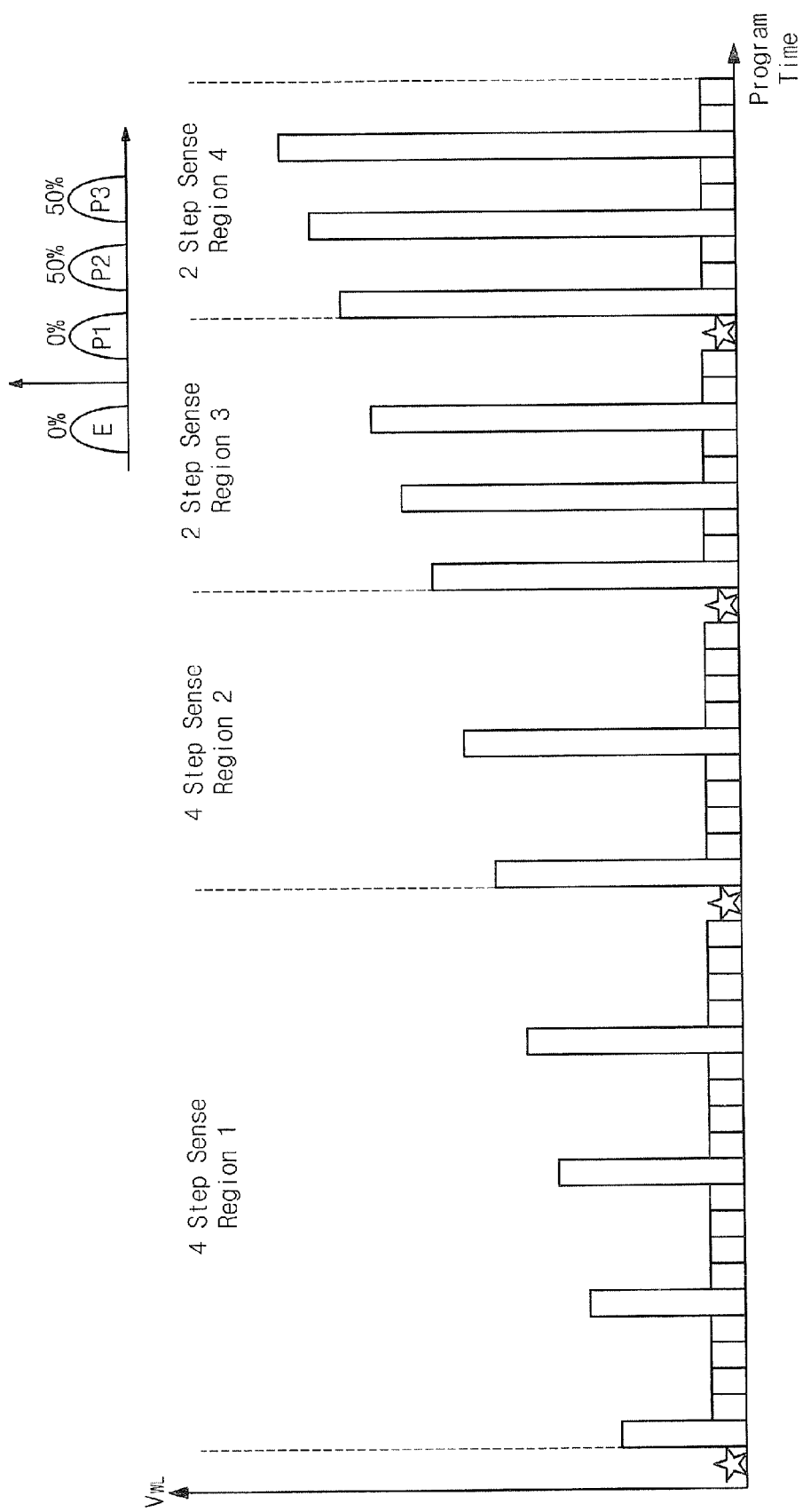

FIGS. 17 and 18 are examples that illustrate the relative performance of performing program-verify operations according to some embodiments of the present invention. As discussed above, program-verify operations can be performed by selectively pre-charging bit lines associated with at least one of a plurality of programmable states for the memory cells to reduce the effects of, for example, CSL noise. As shown in FIG. 17, the memory cells for a page to be verified are programmed such that there are a same number of cells in each of the four programmable states. This may allow a greater number of bit lines to be pre-charged resulting in fewer program-verify operation steps. In the example shown in FIG. 17, only one program-verify step is used throughout the program verification process.

By contrast, FIG. 18 illustrates an example in which 50% of the memory cells are programmed in the P2 state and 50% of the memory cells are programmed in the P3 state. In this example, fewer bit lines are pre-charged at the beginning of the program verification process resulting in an increased number of program-verify operation steps. In the example shown in FIG. 17, four program-verify operation steps are used initially. As more cells complete program verification, the CSL noise may decrease allowing the number of bit lines to be pre-charged to increase and the number of read operation steps to decrease. As shown in FIG. 17, the number of program-verify operation steps is reduced to two after several program loops.

Figure 19:
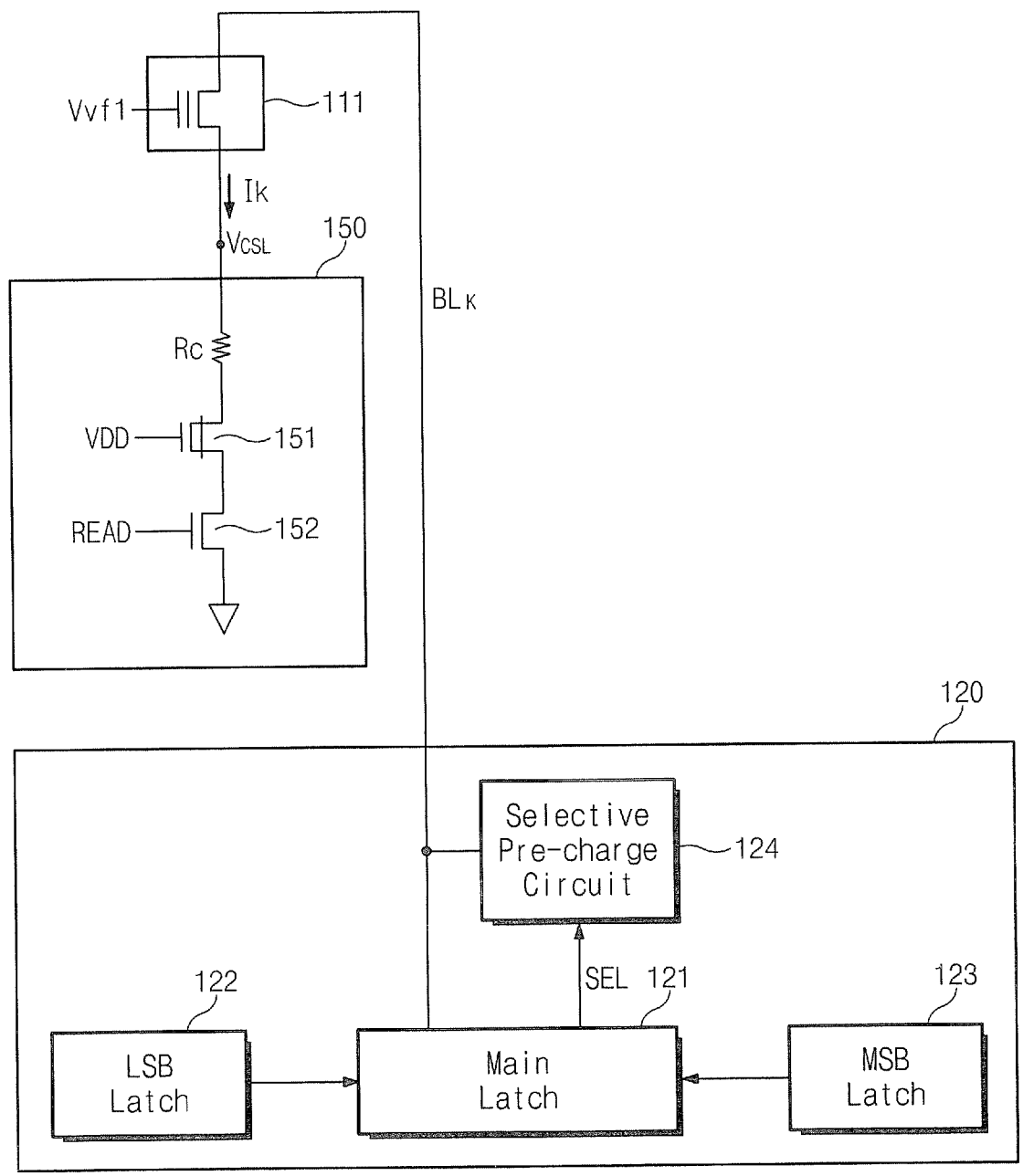
FIG. 19 illustrates a portion of a circuit diagram of the data input/output control circuit shown in FIG. 4.

FIG. 19 illustrates a portion of a circuit diagram of the data input/output control circuit 120 shown in FIG. 4. Referring to FIG. 19, the data input/output control circuit 120 includes a main latch 120, data latches 122 and 123, and a selective pre-charge circuit 124. The number of the data latches is varied according to the number of bits which can be stored into a memory cell. For example, when 2 bits can be stored into a memory cell, the data latches are composed of the LSB latch 122 and the MSB latch as shown FIG. 19.

The main latch 121 is connected to a bit line BLk, and configured to store a program-verify result. For example, when the program-verify result indicates a program pass, the main latch 121 is converted to a pass data (or "1"). When the program-verify result indicates a program fail, the main latch 121 maintains data to be programmed (or "0"). The main latch 121 selectively controls the selective pre-charge circuit 124 according to data stored in the LSB latch 122 and the MSB latch 123. That is, the main latch 121 selectively pre-charges the bit line BLk during the program-verify operation to lessen the CSL noise.

It is assumed that data corresponding to the state P1 is stored in the data latches 122 and 123, and a program-verify operation for the state P1 is operating. The main latch 121 generates a selection signal SEL based on a control of the data latches 122 and 123. The selective pre-charge circuit 124 pre-charges the bit line BLk in response to the selection signal SEL. If data corresponding to the state P2 or P3 is stored in the data latches 122 and 123, the main latch 121 does not generate the selection signal SEL. Then, the bit line BLk maintains a ground reference voltage.

Similarly, the main latch 121 generates the selection signal SEL when data corresponding to the state P2 is stored in the data latches 122 and 123, and a program-verify operation for the state P2 is operating. The main latch 121 also generates the selection signal SEL when data corresponding to the state P3 is stored in the data latches 121 and 123, and a program-verify operation for the state P3 is operating. The main latch 121 generates the selection signal SEL only when a program-verify operation for a state, which corresponds to data stored in the data latches 122 and 123, is operating. The main latch 121 does not generate the selection signal SEL when a program-verify operation for a state, which does not correspond to data stored in the data latches 122 and 123, is operating.

The LSB latch 122 is configured to store a least significant bit (LSB) data. The MSB latch 123 is configured to store a most significant bit (MSB) data. The LSB latch 122 and the MSB latch 123 maintains LSB data and MSB data respectively during the program-verify operation. That is, the LSB latch 122 and the MSB latch maintains multi bit data until the program operation completes.

The selective pre-charge circuit 124 selectively pre-charges the bit line BLk during the program-verify operation based on a control of the main latch 121. The selective pre-charge circuit 124 may be simply implemented by one or more MOS transistors providing a pre-charge voltage to the bit line BLk based on a control of the selection signal SEL.

FIGS. 20A to 20C illustrate threshold voltage distributions during the program-verify operations for the first to second programmed states P1 to P3. In FIGS. 20A to 20C, solid lines indicate that corresponding bit lines are pre-charged, and dotted lines indicates that corresponding bit lines are not pre-charged during the program-verify operations.

FIG. 20A shows an example illustrating pre-charge of bit lines corresponding to the first programmed state P1 when the first program-verifying voltage Vvfy1 is applied. Referring to FIG. 20A, bit lines corresponding to the erased state E are not pre-charged. FIG. 20B shows an example that bit lines corresponding to the second programmed state P2 is pre-charged when the second program-verifying voltage Vvfy2 is applied. Referring to FIG. 20B, bit lines corresponding to the erased state E and the first programmed state P1 are not pre-charged. Similarly, in FIG. 20C, bit lines corresponding to the third programmed state P3 is pre-charged, but rest bit lines corresponding to the erased state E and the first and second programmed states P1 and P2 are not pre-charged.

The flash memory device 100 according to an embodiment of the present invention selectively pre-charges bit lines according to data stored in the data input/output control circuit 120 during the program-verify operation. According to some embodiments of the present invention, it is able to reduce the likelihood that threshold voltage distributions are widened by lessening the CSL noise during the program-verify operation.

Figure 21:
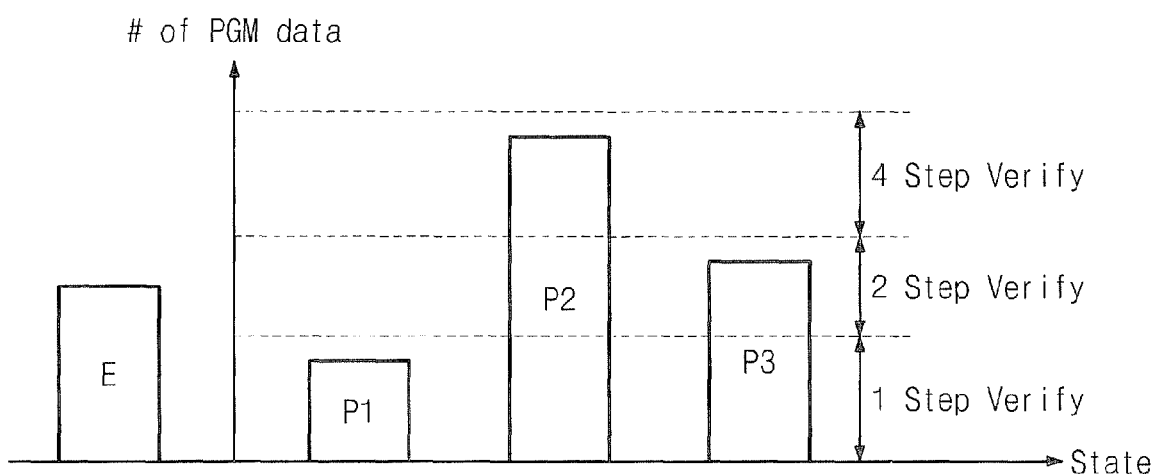
FIG. 21 is a graphic diagram exemplarily showing the number of program data bits respective to the programmed states.
Figure 22:
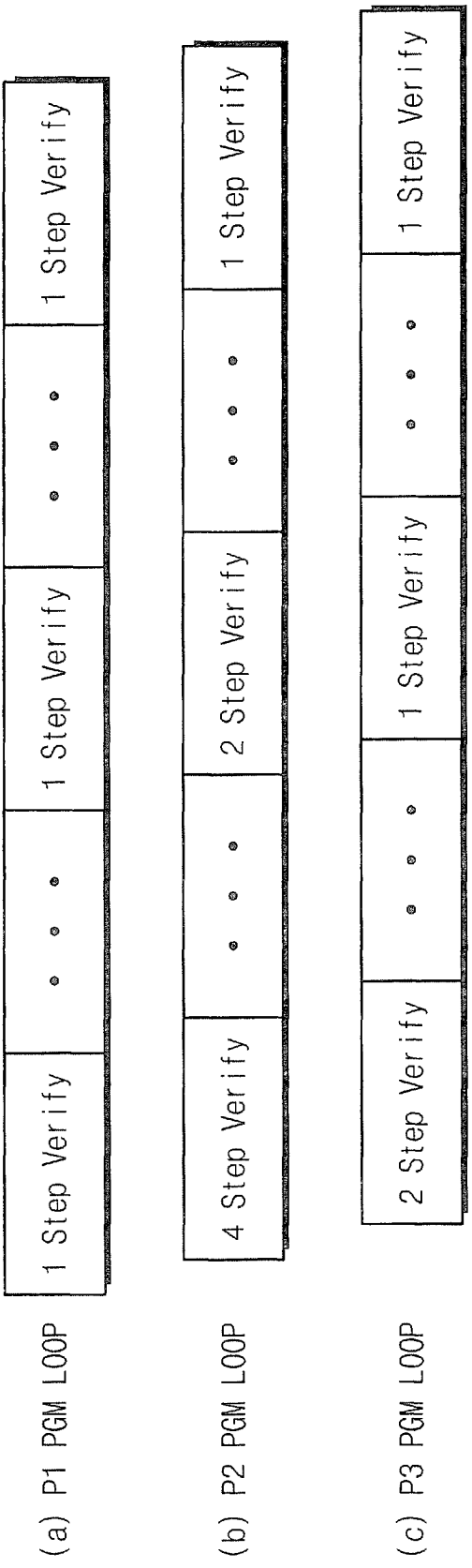
FIGS. 22A through 22C are diagrams showing program loops respective to the programmed states.
Figure 23:
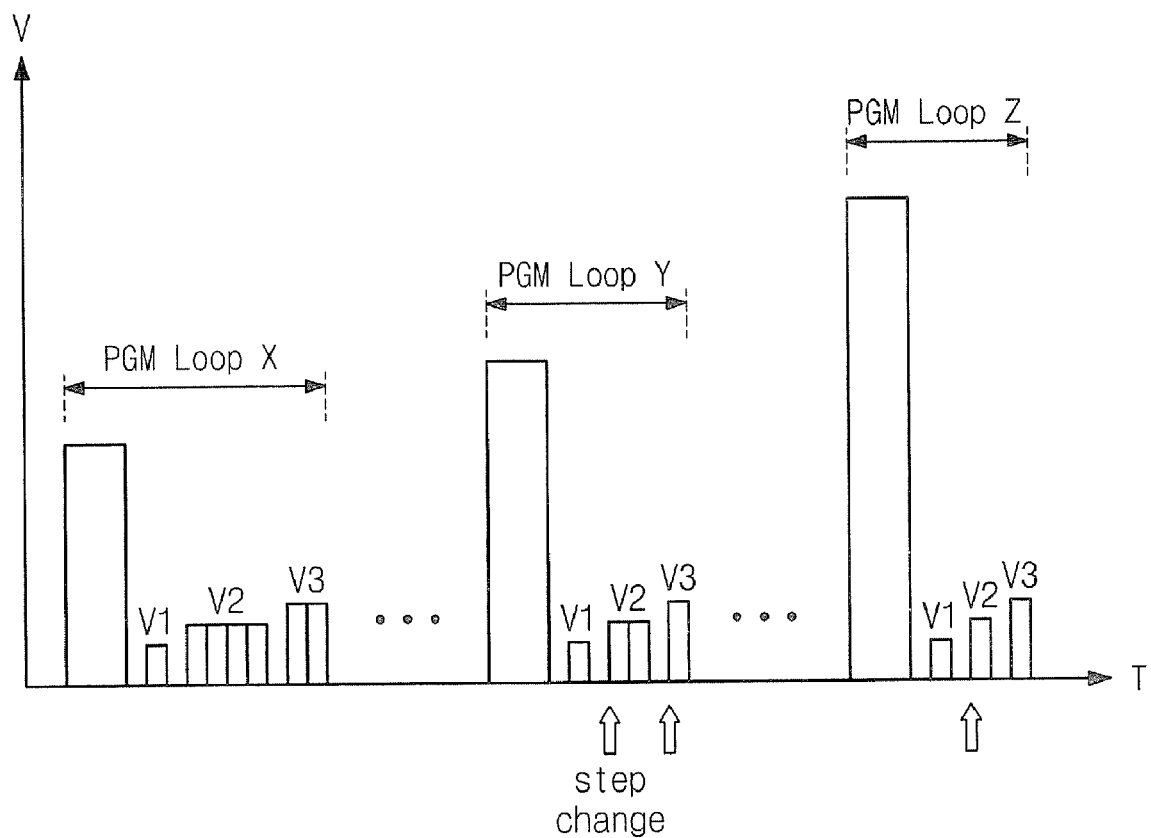
FIG. 23 is a graphic diagram showing an example of programming loops of the flash memory device of FIG. 4.

FIGS. 21 through 23 show a method for adjusting the number of split regions by the number of program data bits. Hereinafter it will be assumed that the flash memory device 100 includes the memory cell array 110 and the input/output control circuit 120, and the memory cells are conditioned over the erased state E, and the programmed states P1, P2, and P3.

FIG. 21 is a graphic diagram exemplarily showing the number of program data bits respective to the programmed states. Referring to FIG. 21, the horizontal axis represents the states of memory cells and the vertical axis represents the number of program data bits. In FIG. 21, the number of program data bits by the programmed state P1 is correspondent to the 1-step verifying mode. The number of program data bits by the programmed state P2 is correspondent to the 4-step verifying mode. And, the number of program data bits by the programmed state P3 is correspondent to the 2-step verifying mode. Therefore, the programming operation of the state P1 at the beginning is executed in the 1-step verifying mode. The programming operation of the state P2 is executed in the 4-step verifying mode. And, the programming operation of the state P3 is executed in the 2-step verifying mode.

FIGS. 22A through 22C are diagrams showing program loops for the respective programmed states. FIG. 22A shows a format of the programming loop for the programmed state P1, FIG. 22B shows a format of the programming loop for the programmed state P2, and FIG. 22C shows a format of the programming loop for the programmed state P3. At the beginning of the programming operation, the P1 programming loop is carried out in the 1-step verifying mode, the P2 programming loop is carried out in the 4-step verifying mode, and the P3 programming loop is carried out in the 2-step verifying mode.

While prosecuting the programming operation, if the number of P2 program data bits decreases to the level corresponding to the 2-step verifying mode, the P2 programming loop is conducted in the 2-step verifying mode. And, if the number of P3 program data bits decreases to the level corresponding to the 1-step verifying mode, the P3 programming loop is conducted in the 1-step verifying mode. Meanwhile, as the number of P1 program data bits is still conditioned in the level corresponding to the 1-step verifying mode, the P1 programming loop is continuously conducted in the 1-step verifying mode.

While prosecuting the programming operation, if the number of P2 program data bits decreases to the level corresponding to the 1-step verifying mode, the P2 programming loop is conducted in the 1-step verifying mode. And, the numbers of P1 and P3 program data bits are still conditioned in the level corresponding to the 1-step verifying mode, so the P1 and P2 programming loops are continuously conducted in the 1-step verifying mode.

FIG. 23 is a graphic diagram showing an example of programming loops of the flash memory device 100 of FIG. 4. On the graph of FIG. 23, the horizontal axis indicates the programming time along the programming loops and the vertical axis indicates voltage levels of the program voltage Vpgm and the program-verifying voltage Vvfy which are applied to the word line. In FIG. 23, V1, V2, and V3 represent the program-verifying voltages Vvfy1, Vvfy2, and Vvfy3 respectively.

The programming operation of an MLC flash memory device is carried out by including one-time program execution and plural-times program verification in each programming loop. During the program execution, the program voltage Vpgm is applied to the selected word line. During the program verification, the program-verifying voltages V1, V2, and V3 are sequentially applied to the selected word line. The first program-verifying voltage V1 is provided to program the selected memory cells into the first programmed state P1. The second program-verifying voltage V2 is provided to program the selected memory cells into the second programmed state P2. And, the third program-verifying voltage V3 is provided to program the selected memory cells into the third programmed state P3.

Figure 20:
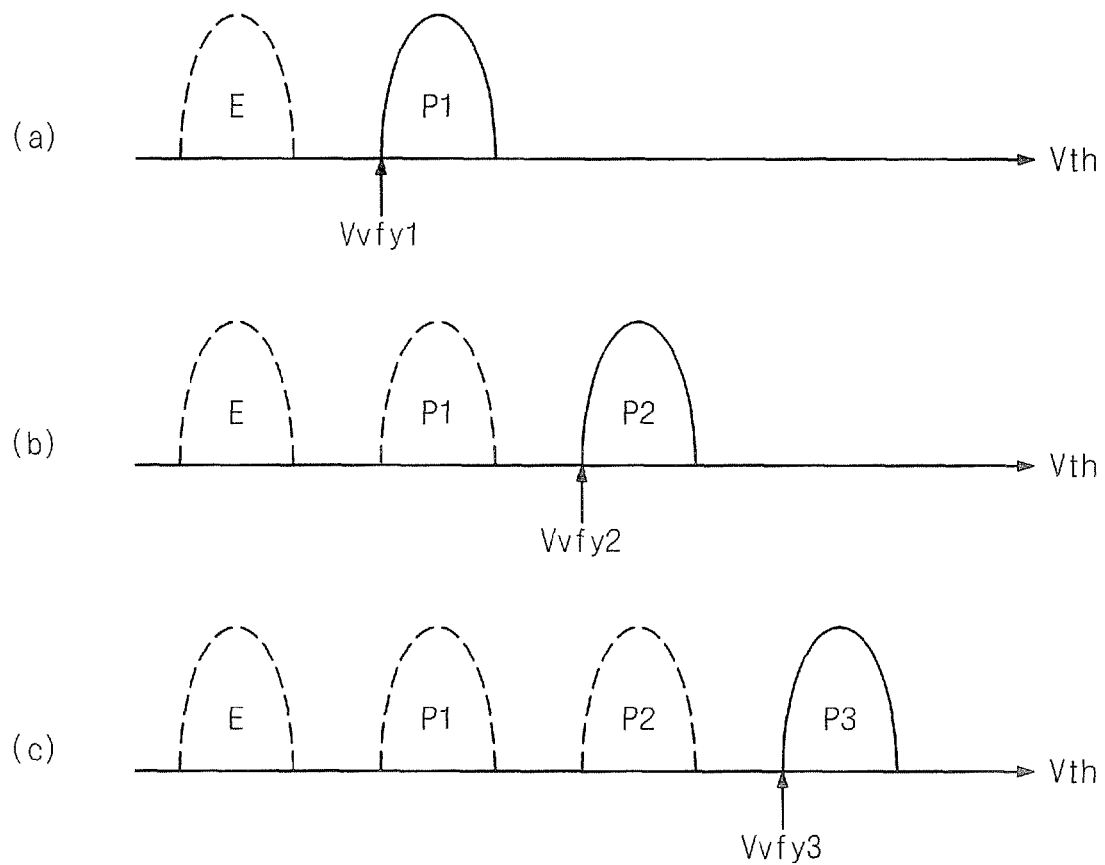
FIG. 20A to 20C illustrate threshold voltage distributions during the program-verify operations for the first to second programmed states P1 to P3.

The flash memory device 100 according to some embodiments of the present invention is operable by differentiating the number of split regions every program-verifying operation in each programming loop. Referring to FIG. 20, in the programming loop X, the P1 program-verifying operation is executed in the 1-step verifying mode without regional split. The P2 program-verifying operation is executed in the 4-step verifying mode. And The P3 program-verifying operation is executed in the 2-step verifying mode.

In the programming loop Y, the P1 program-verifying operation continues to be executed in the 1-step verifying mode. But the P2 program-verifying operation turns to the 2-step verifying mode from the 4-step verifying mode. And, the P3 program-verifying operation turns to the 1-step verifying mode from the 2-step verifying mode. This change of verifying mode is because the number of program data bits increases along the progress of the programming operation.

In the programming loop Z, the P1 program-verifying operation continues to be executed in the 1-step verifying mode. The P2 program-verifying operation turns to the 1-step verifying mode from the 2-step verifying mode. And, the P3 program-verifying operation is continuously carried out in the 1-step verifying mode.

Figure 24:
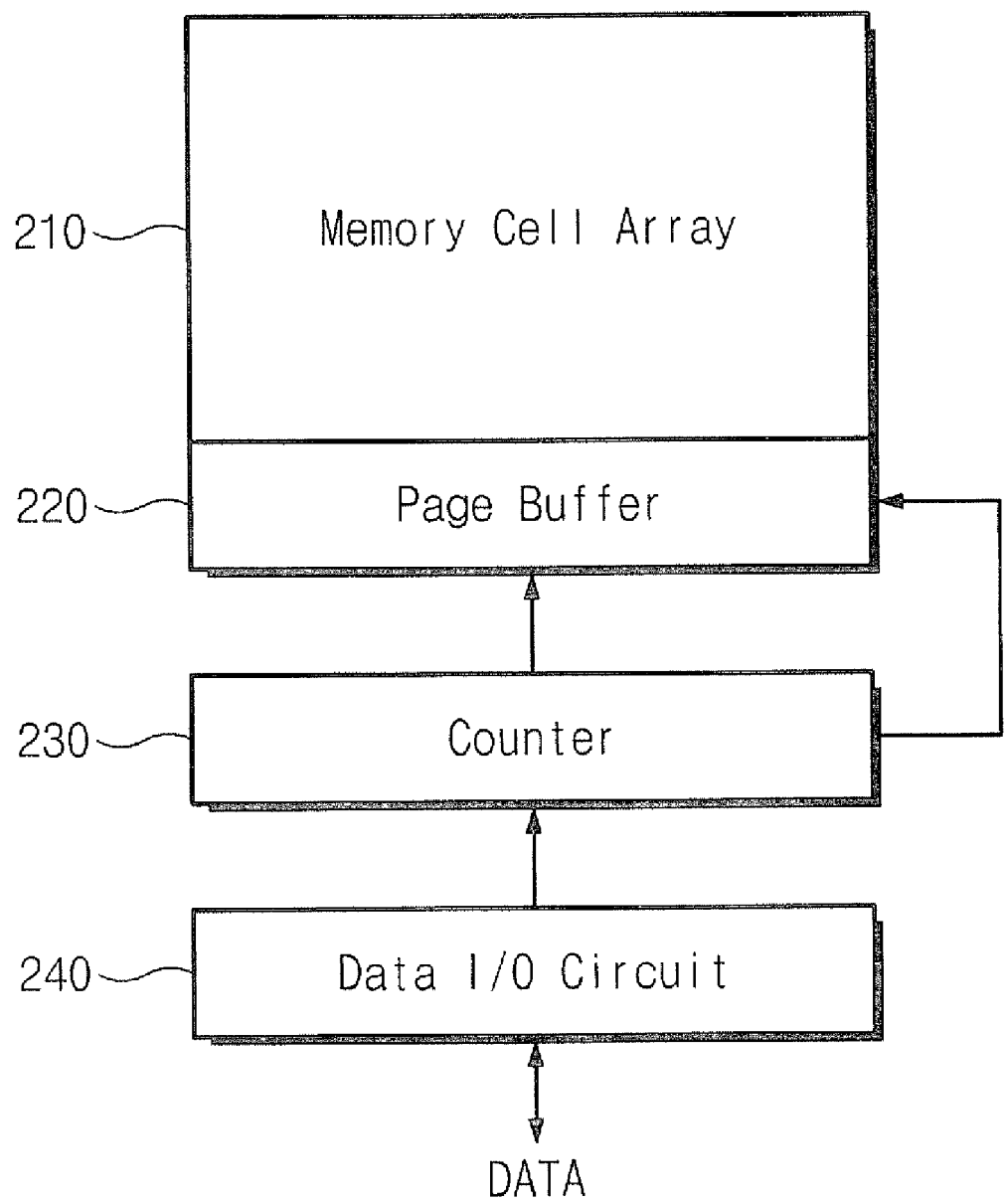
FIGS. 24 and 25 are an embodiment of block diagrams exemplarily showing configurations of the flash memory device controlling the number of split regions in accordance with program data.
Figure 25:
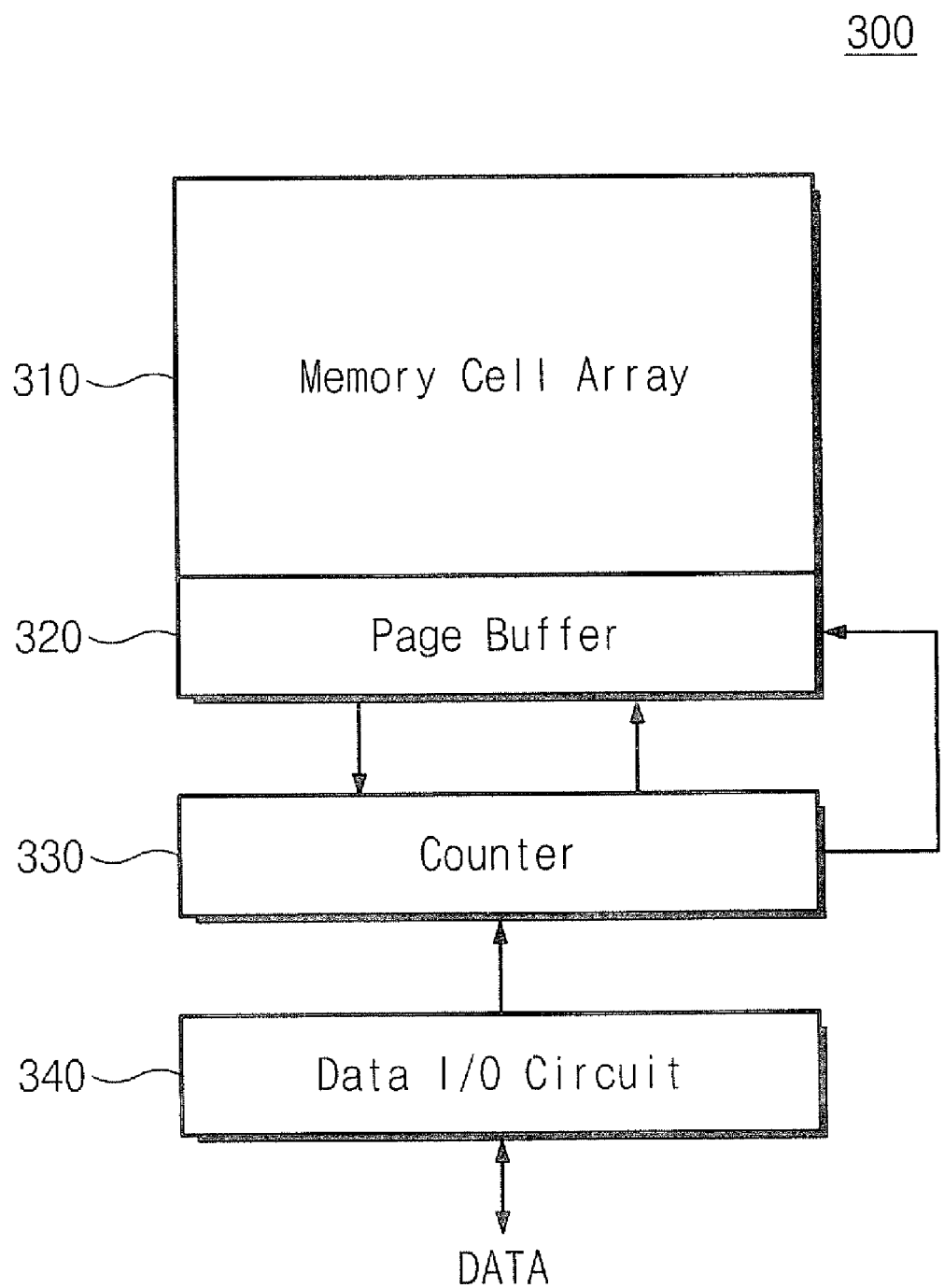

FIGS. 24 and 25 are an embodiment of block diagrams exemplarily showing configurations of the flash memory device controlling the number of split regions in accordance with program data. Referring to FIG. 24, the flash memory device 200 is comprised of a memory cell array 210, a page buffer 220, a counter 230, and a data input/output circuit 240. In FIG. 24, the page buffer 220, the counter 230, and the data input/output circuit 240 may be included in the data input/output control circuit 120 shown in FIG. 4.

The data input/output control circuit conducts the program-verifying operation to data programmed into the memory cell array 210. The data input/output control circuit counts the number of program data bits corresponding each to the programmed states, and executes the program-verify operation by splitting a page of memory cells into a plurality of regions.

The page buffer 220 temporarily holds data that will be stored in memory cells or data read out from memory cells. The page buffer 220 includes one or more latch circuits (not shown) for holding data.

The counter 230 operates to count the number of data bits which are input through the data input/output circuit 240. For instance, the counter 230, as shown in FIG. 21, counts the number of program data bits for the states E, P1, P2, and P3. The counter 230 provides the page buffer 220 with a signal for adjusting the number of split regions in accordance with the number of program data bits. The page buffer 230 adjusts the number of split regions every programming loop in response to the signal of the counter 230.

Now, referring to FIG. 25, the flash memory device 300 is comprised of a memory cell array 310, a page buffer 330, a counter 340, and a data input/output circuit 340. The counter 330 is able to generate a signal for adjusting the number of split regions by means of data input through the data input/output circuit 340 and the page buffer 320. In FIG. 25, the page buffer 320, the counter 330, and the data input/output circuit 340 may be included in the data input/output circuit 120 of FIG. 4.

It is now assumed that a memory cell of the flash memory device 300 shown in FIG. 25 is designed to store 2-bit data. First data input to the flash memory device 300 is referred to as "LSB data" and later data input to thereto is referred to as "MSB data." The flash memory device 300 is able to program LSB and MSB data at the same time, or program MSB data after programming LSB data.

In programming LSB and MSB data at the same time, the LSB data is first stored in the page buffer 320. In programming MSB data after LSB data, the LSB data read from the memory cell array 310 is stored in the page buffer 320. The counter 330 is able to count the number of program data bits, corresponding to each of the programmed states, by means of LSB data stored in the page buffer 320 and MSB data input from the data input/output circuit 340.

Figure 26:
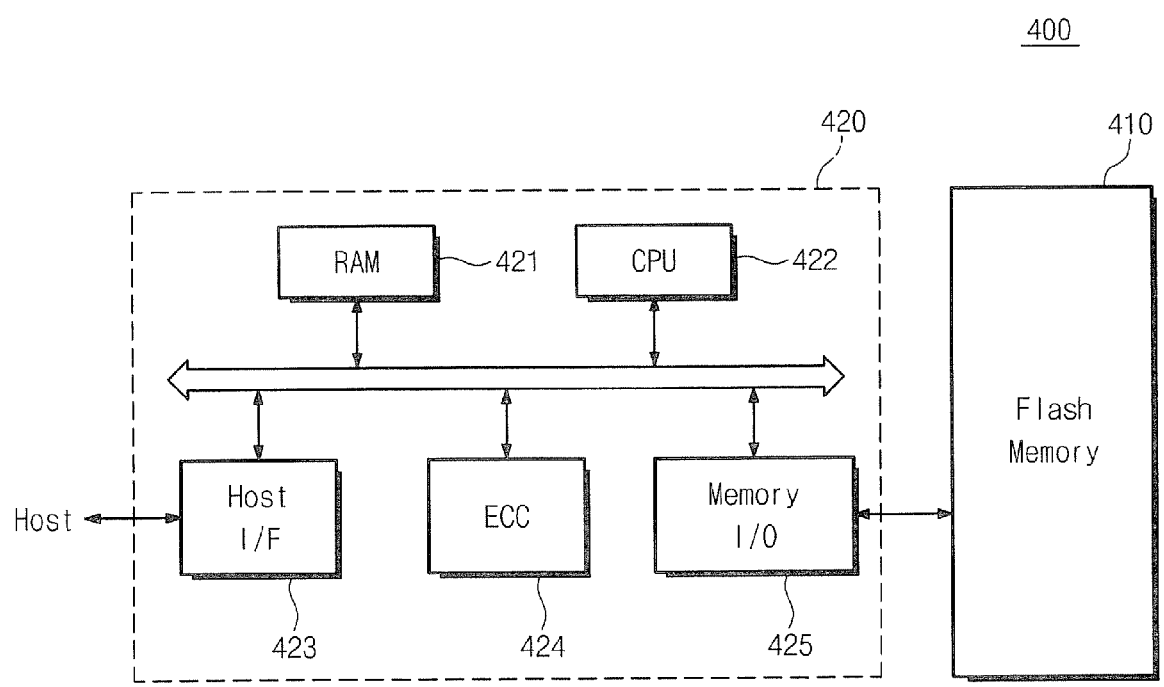
FIG. 26 is a block diagram that illustrates a memory card 400 that comprises a nonvolatile memory according to some embodiments of the present invention.

FIG. 26 is a block diagram that illustrates a memory card 400 that comprises a nonvolatile memory, such as a flash memory 310, according to some embodiments of the present invention. The memory card comprises a memory controller, which comprises an RAM 421, a CPU 422, a host interface 423, an error correction code (ECC) module 424, and a memory interface 425 that are communicatively coupled by an address/data bus. The memory controller 420 communicates with the flash memory 410 via the memory interface 425. The flash memory 410 may be embodied as discussed above with respect to FIGS. 4-25.

Figure 27:
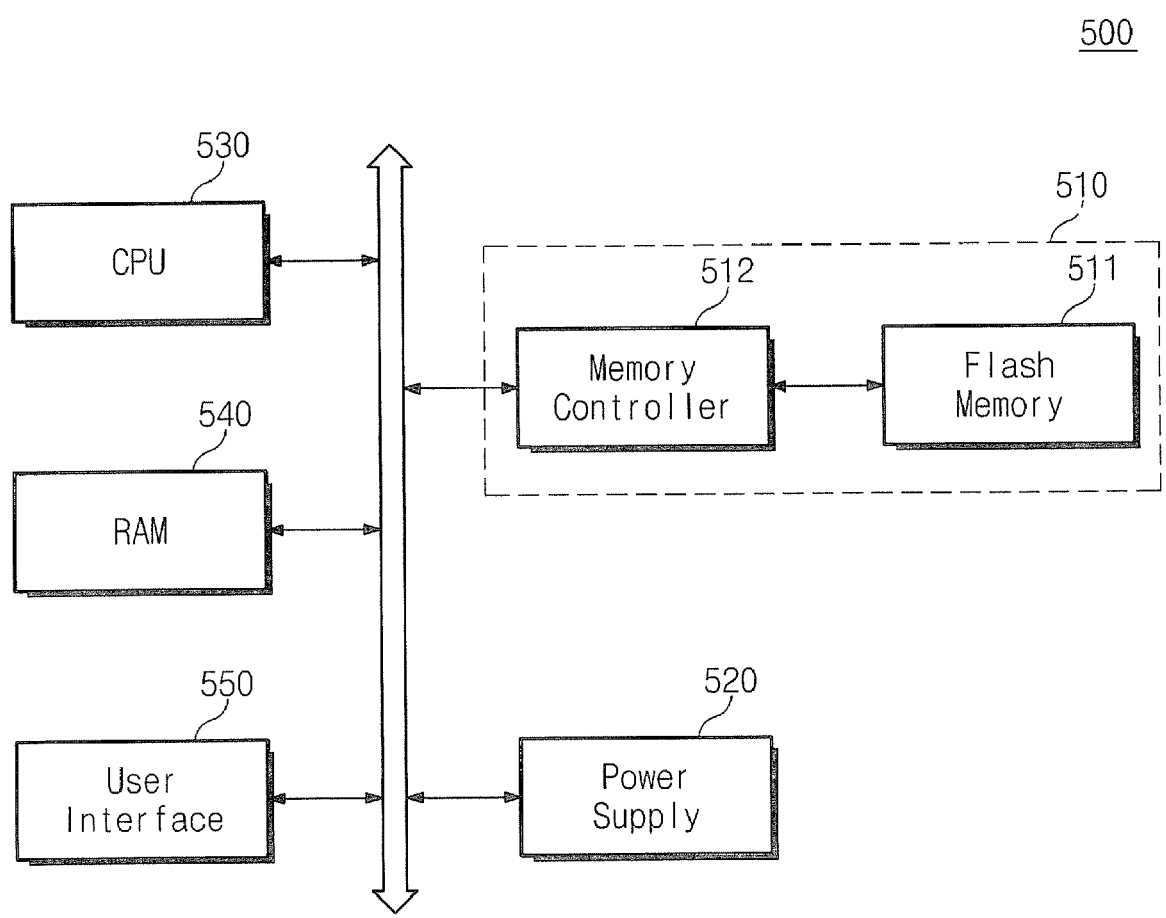
FIG. 27 is a memory system that includes a nonvolatile memory, such as a flash memory, according to some embodiments of the present invention.

FIG. 27 is a memory system 500 that includes a nonvolatile memory, such as a flash memory, according to some embodiments of the present invention. As shown in FIG. 27, the memory system 500 comprises a memory card 510 comprising a memory controller 512 coupled to a flash memory 511, which may be embodied, for example, as the memory card 400 of FIG. 26 or a solid state drive SSD. The memory system 500 further comprises a CPU 530, RAM 540, user interface 550, and power supply 520 that are coupled to each other and the memory card 510 by an address/data bus. The flash memory 511 may be embodied as discussed above with respect to FIGS. 4-25.

Memory devices, cards, and/or systems of FIGS. 4-27 may be embodied in, for example, a memory card device, Solid State Drive (SSD) device, ATA bus device, Serial ATA (SATA) bus device, Small Computer System Interface (SCSI) device, Serial Attached SCSI (SAS) device, Multi-Media Card (MMC) device, Secure Digital (SD) device, memory stick device, Hard Disk Drive (HDD) device, Hybrid Hard Drive (HHD) device, and/or a Universal Serial Bus (USB) flash drive device.

Moreover, memory devices, cards, and/or systems of FIGS. 4-27 may be embodied in, for example, a graphics card, a computer, a mobile terminal, a Personal Digital Assistant (PDA), a camera, a game console, an MP3 player, a television, a DVD player, a router, a GPS system, and/or a Camera Image Processor (CIS) and application chipset.

Memory devices, cards, and/or systems, according to some embodiments of the present invention, may be placed on a computer system via a variety of package types including Package-on-Package (PoP), Ball Grid Arrays (BGAs), Chip Scale Packages (CSPs), Plastic Leaded Chip Carrier (PLCC), Plastic Dual In-line Package (PDIP), Die in Waffle Pack, Die in Wafer Form, Chip-On-Board (COB), CERamic Dual In-line Package (CERDIP), Plastic Metric Quad Flat Pack (MQFP), Thin Quad Flat Pack (TQFP), Small Outline (SOIC), Shrink Small Outline Package (SSOP), Thin Small Outline (TSOP), Thin Quad Flat Pack (TQFP), System In Package (SIP), Multi-Chip Package (MCP), Wafer-level Fabricated Package (WFP), Wafer-level Processed Stack Package (WSP), and/or Wafer-level Processed Package (WSP), among others. In some embodiments of the present invention, the memory cells of a flash memory device may be structured in various forms having charge storage layers. A charge storage architecture of the flash memory device may be implemented by including charge-trapping layers, stacked cell arrays where plural cell arrays are stacked, flash structures without source and drain regions, and/or pin-type flash structures, among others.

Many variations and modifications can be made to the embodiments without substantially departing from the principles of the present invention. All such variations and modifications are intended to be included herein within the scope of the present invention, as set forth in the following claims.

That which is claimed:

1. A method of operating a nonvolatile memory device, comprising:
   performing a program loop on each of a plurality of memory cells, each program loop comprising at least one program-verify operation;
   determining a noise level in the memory device; and
   selectively pre-charging bit lines associated with each of the plurality of memory cells during the at least one program-verify operation based on the determined noise level.

2. The method of claim 1, wherein the noise level is based on a parasitic resistance of a column select line associated with the plurality of memory cells.

3. The method of claim 1, further comprising:
   determining when the noise level falls below a threshold;
   increasing a number of bit lines selectively pre-charged when the noise level falls below the threshold; and
   reducing a number of the at least one program-verify operation when the noise level falls below the threshold.

4. The method of claim 3, wherein determining when the noise level falls below the threshold comprises:
   determining the noise level during each of the program loops; and
   comparing the determined noise level with the threshold.

5. The method of claim 3, wherein determining when the noise level falls below the threshold comprises:
   determining the noise level at specific intervals during performing the program loops; and
   comparing the determined noise level with the threshold.

6. The method of claim 1, wherein determining the noise level comprises:
   determining the noise level before performing the program loops; and
   wherein selectively pre-charging the bit lines comprises:
   selectively pre-charging the bit lines based on the noise level determined before performing the program loops;
   the method further comprising:
   determining a number of the at least one program-verify operation based on the noise level determined before performing the program loops.

7. The method of claim 6, further comprising:
   increasing a number of bit lines selectively pre-charged after a predetermined number of program loops; and
   reducing the number of the at least one program-verify operation after the predetermined number of program loops.

8. The method of claim 1, wherein each of the memory cells is a multi-level cell having a plurality of programmable states and wherein selectively pre-charging the bit lines comprises:
   selectively pre-charging bit lines associated with at least one of the plurality of programmable states.

9. A memory system, comprising:
   a memory controller; and
   a nonvolatile memory communicatively coupled to the memory controller, the memory being operable to perform a program loop on each of a plurality of memory cells, each program loop comprising at least one program-verify operation, to determine a noise level in the memory device, and to selectively pre-charge bit lines associated with each of the plurality of memory cells during the at least one program-verify operation based on the determined noise level.

10. The system of claim 9, wherein the noise level is based on a parasitic resistance of a column select line associated with the plurality of memory cells.

11. The system of claim 9, wherein the memory is further operable to determine when the noise level falls below a threshold, to increase a number of bit lines selectively pre-charged when the noise level falls below the threshold, and to reduce a number of the at least one program-verify operation when the noise level falls below the threshold.

12. The system of claim 11, wherein the memory is operable to determine when the noise level falls below the threshold by determining the noise level during each of the program loops and comparing the determined noise level with the threshold.

13. The system of claim 11, wherein the memory is operable to determine when the noise level falls below the threshold by determining the noise level at specific intervals during performing the program loops, the memory being further operable to compare the determined noise level with the threshold.

14. The system of claim 9, wherein the memory is operable to determine the noise level by determining the noise level before performing the program loops, to selectively pre-charge the bit lines by selectively pre-charging the bit lines based on the noise level determined before performing the program loops, the memory being further operable to determine a number of the at least one program-verify operation based on the noise level determined before performing the program loops.

15. The system of claim 14, wherein the memory is further operable to increase a number of bit lines selectively pre-charged after a predetermined number of program loops, and to reduce the number of the at least one program-verify operation after the predetermined number of program loops.

16. The system of claim 9, wherein each of the memory cells is a multi-level cell having a plurality of programmable states and wherein the memory is operable to selectively pre-charge the bit lines by selectively pre-charging bit lines associated with at least one of the plurality of programmable states.

17. A nonvolaitle memory device comprising:
   a memory cell array having a plurality of memory cells connected between a common source line and a bit line, each memory cell being conditioned in a plurality of programmed states; and
   a data input/output control circuit conducting a program-verify operation on data programmed (hereinafter, referred to as 'program data') in the memory cell array, wherein the data input/output control circuit counts the number of program data bits corresponding each to the programmed states during the program-verify operation and conducts the program-verify operation by regional split with the plurality of memory cells in accordance with the number of program data bits.

18. The nonvolatile memory device of claim 17, wherein the data input/output control circuit comprises:

a data input/output circuit receiving the program data; and
a counter counting the number of program data bits input from the data input/output circuit.

* * * * *